(12) United States Patent
Park et al.

(10) Patent No.: US 10,777,560 B2
(45) Date of Patent: Sep. 15, 2020

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Jonghyuk Park, Hwaseong-si (KR); Byoungho Kwon, Hwaseong-si (KR); Inho Kim, Ansan-si (KR); Hyesung Park, Anyang-si (KR); Jin-Woo Bae, Yongin-si (KR); Yanghee Lee, Incheon (KR); Inseak Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/833,914

(22) Filed: Mar. 30, 2020

(65) Prior Publication Data

US 2020/0227419 A1   Jul. 16, 2020

Related U.S. Application Data

(60) Division of application No. 16/110,658, filed on Aug. 23, 2018, which is a continuation-in-part of (Continued)

(30) Foreign Application Priority Data

May 13, 2015 (KR) .......................... 10-2015-0066801

(51) Int. Cl.
*H01L 27/108* (2006.01)
*H01L 21/66* (2006.01)

(52) U.S. Cl.
CPC ........ *H01L 27/10855* (2013.01); *H01L 22/32* (2013.01); *H01L 22/34* (2013.01);
(Continued)

(58) Field of Classification Search
CPC ..................... H01L 29/66795; H01L 29/0847
See application file for complete search history.

(56) References Cited

U.S. PATENT DOCUMENTS 7,436,014 B2   10/2008   Son
7,501,668 B2    3/2009   Jang et al.
(Continued)

FOREIGN PATENT DOCUMENTS

JP       3279302 B2     4/2002
JP    2005-243689 A     9/2005
(Continued)

OTHER PUBLICATIONS

U.S. Office Action dated Oct. 18, 2018 issued in co-pending U.S. Appl. No. 15/093,033.
(Continued)

*Primary Examiner* — Seahvosh Nikmanesh
(74) *Attorney, Agent, or Firm* — Harness, Dickey & Pierce, P.L.C.

(57) ABSTRACT

Provided are a semiconductor device and a method of fabricating the same. The semiconductor device may include a semiconductor substrate including a first region and a second region, a dummy separation pattern provided on the second region of the semiconductor substrate to have a recessed region at its upper portion, a first electrode provided on the first region of the semiconductor substrate, a dielectric layer covering the first electrode, a second electrode provided on the dielectric layer, and a remaining electrode pattern provided in the recessed region. The second electrode and the remaining electrode pattern may be formed of a same material.

9 Claims, 44 Drawing Sheets

Related U.S. Application Data application No. 15/093,033, filed on Apr. 7, 2016, now abandoned.

(52) U.S. Cl.
CPC .. *H01L 27/10817* (2013.01); *H01L 27/10876* (2013.01); *H01L 27/10894* (2013.01); *H01L 27/10814* (2013.01)

(56) References Cited

U.S. PATENT DOCUMENTS

| | | | |
|---|---|---|---|
| 8,927,426 | B2 | 1/2015 | Lee et al. |
| 9,018,768 | B2 | 4/2015 | Park et al. |
| 9,240,330 | B2 | 1/2016 | Takeda et al. |
| 10,535,533 | B2 * | 1/2020 | Lee ............... H01L 27/10817 |
| 2009/0256182 | A1 | 10/2009 | Sukekawa |
| 2013/0020719 | A1 | 1/2013 | Jung et al. |
| 2013/0087855 | A1 | 4/2013 | Makiyama et al. |
| 2013/0181330 | A1 | 7/2013 | Ramachandran et al. |
| 2015/0102395 | A1 | 4/2015 | Park et al. |
| 2015/0108605 | A1 | 4/2015 | Park et al. |
| 2015/0145124 | A1 | 5/2015 | Kang et al. |
| 2016/0020145 | A1 | 1/2016 | Lee et al. |
| 2016/0336327 | A1 | 11/2016 | Park et al. |

FOREIGN PATENT DOCUMENTS

| | | |
|---|---|---|
| KR | 1999-0081483 | 11/1999 |
| KR | 2000-0075305 A | 12/2000 |
| KR | 10-0555486 B1 | 3/2006 |
| KR | 10-2006-0124315 | 12/2006 |
| KR | 10-0753134 B1 | 8/2007 |
| KR | 10-0868925 B1 | 11/2008 |
| KR | 10-2011-0077964 | 7/2011 |

OTHER PUBLICATIONS

U.S. Notice of Allowance dated Dec. 3, 2019 in corresponding U.S. Appl. No. 16/386,731.
U.S. Office Action dated Jan. 27, 2020 for corresponding U.S. Appl. No. 16/110,658.
U.S. Notice of Allowance dated Apr. 3, 2020 for corresponding U.S. Appl. No. 16/110,658.
U.S. Notice of Allowance dated Apr. 17, 2020 for corresponding U.S. Appl. No. 16/814,387.

* cited by examiner

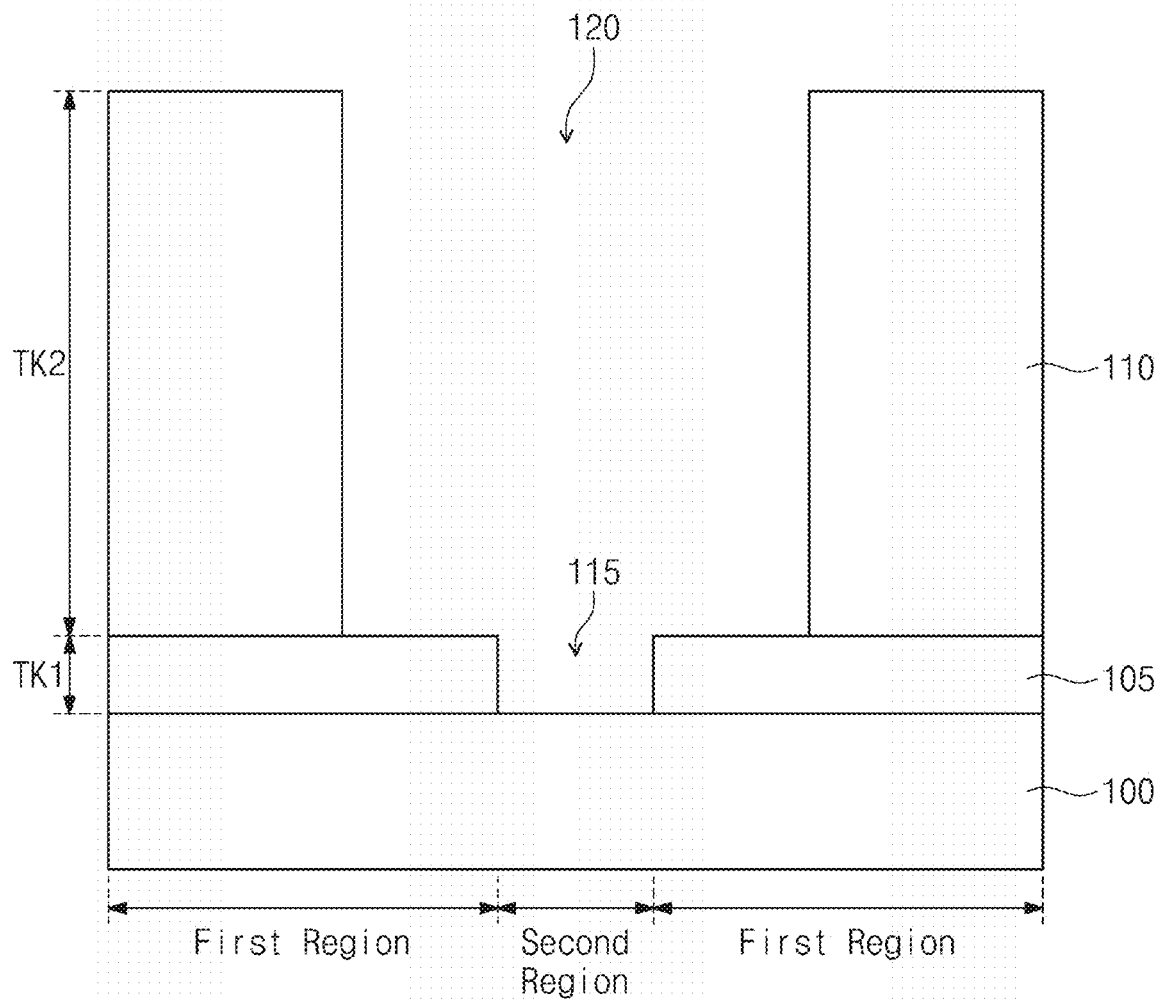

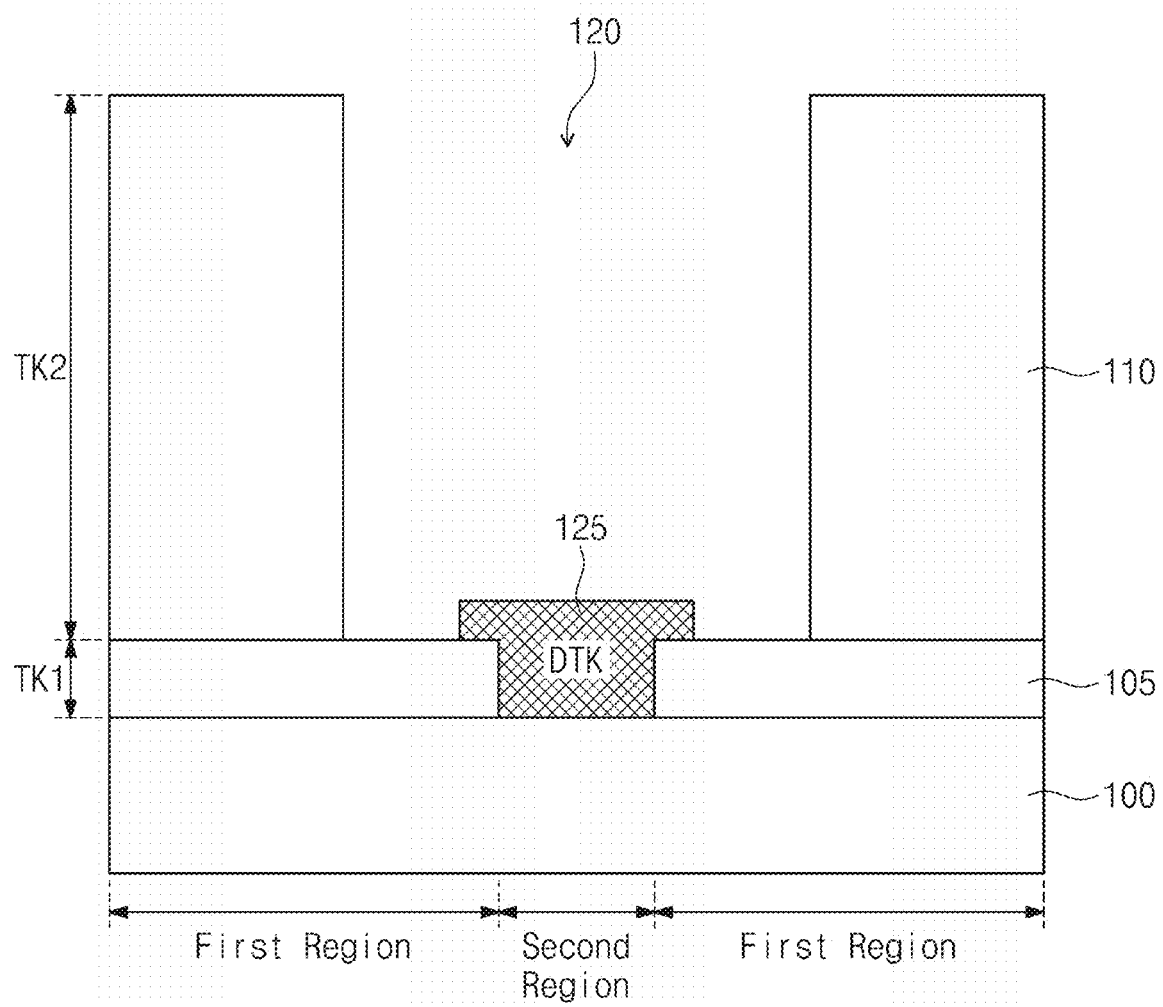

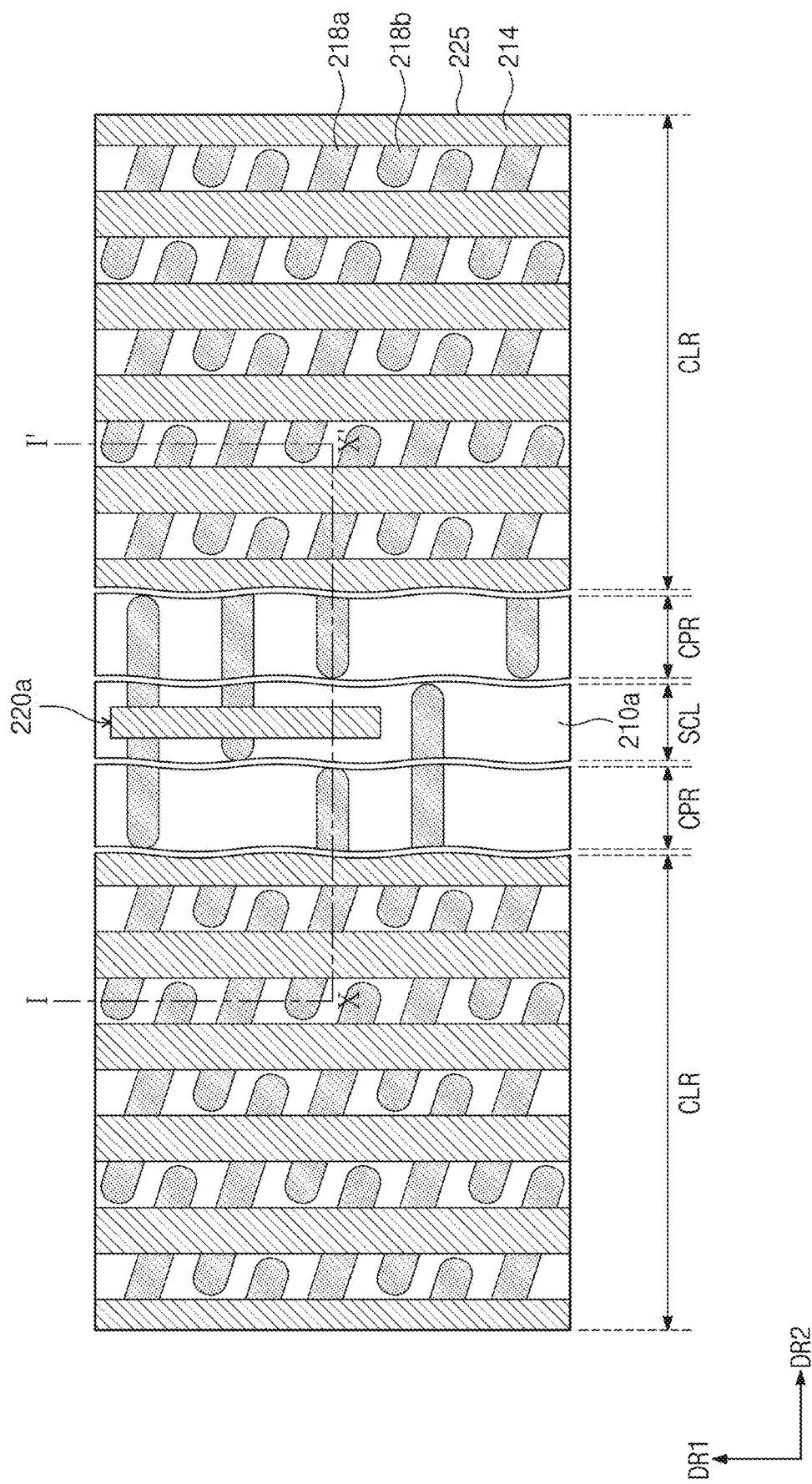

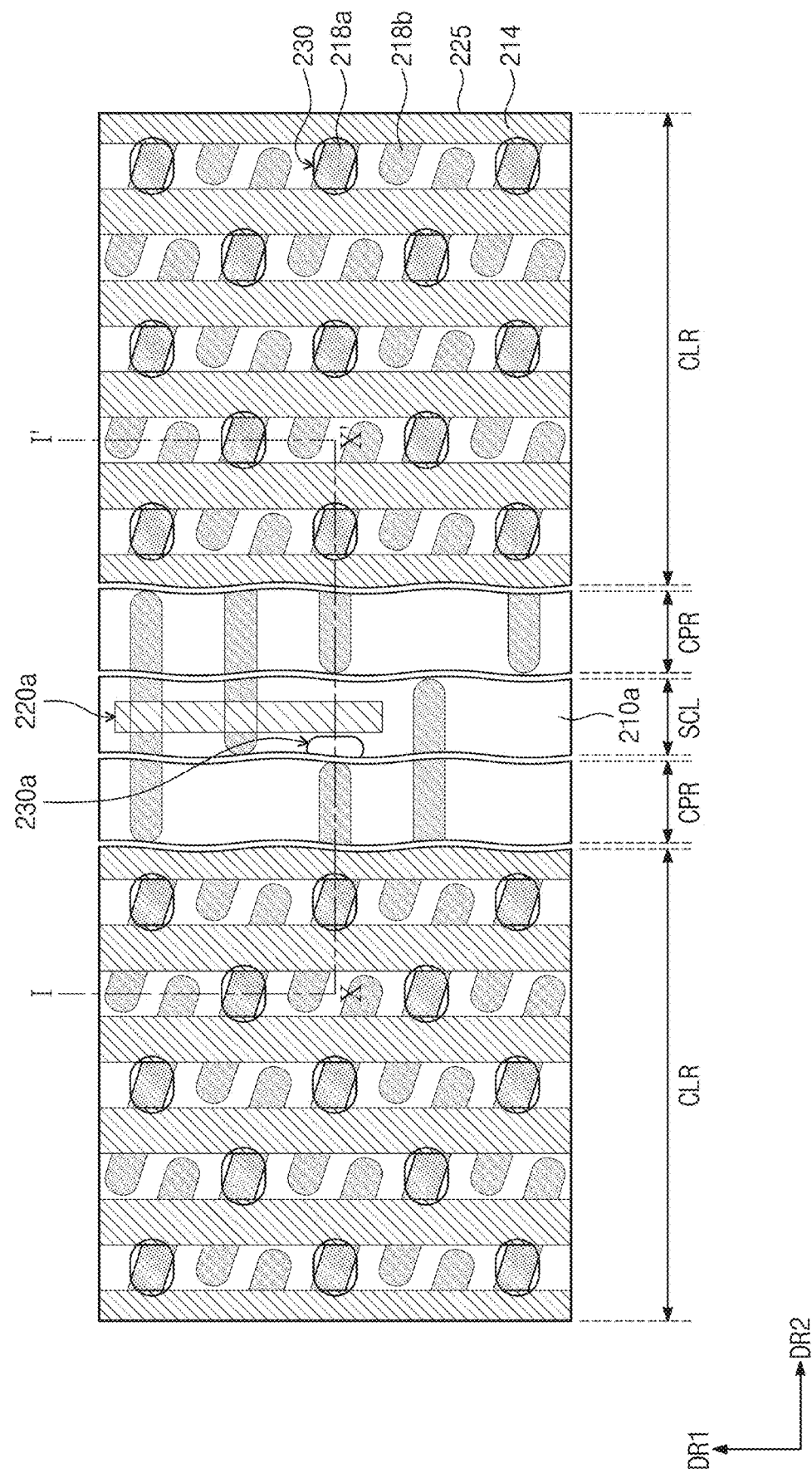

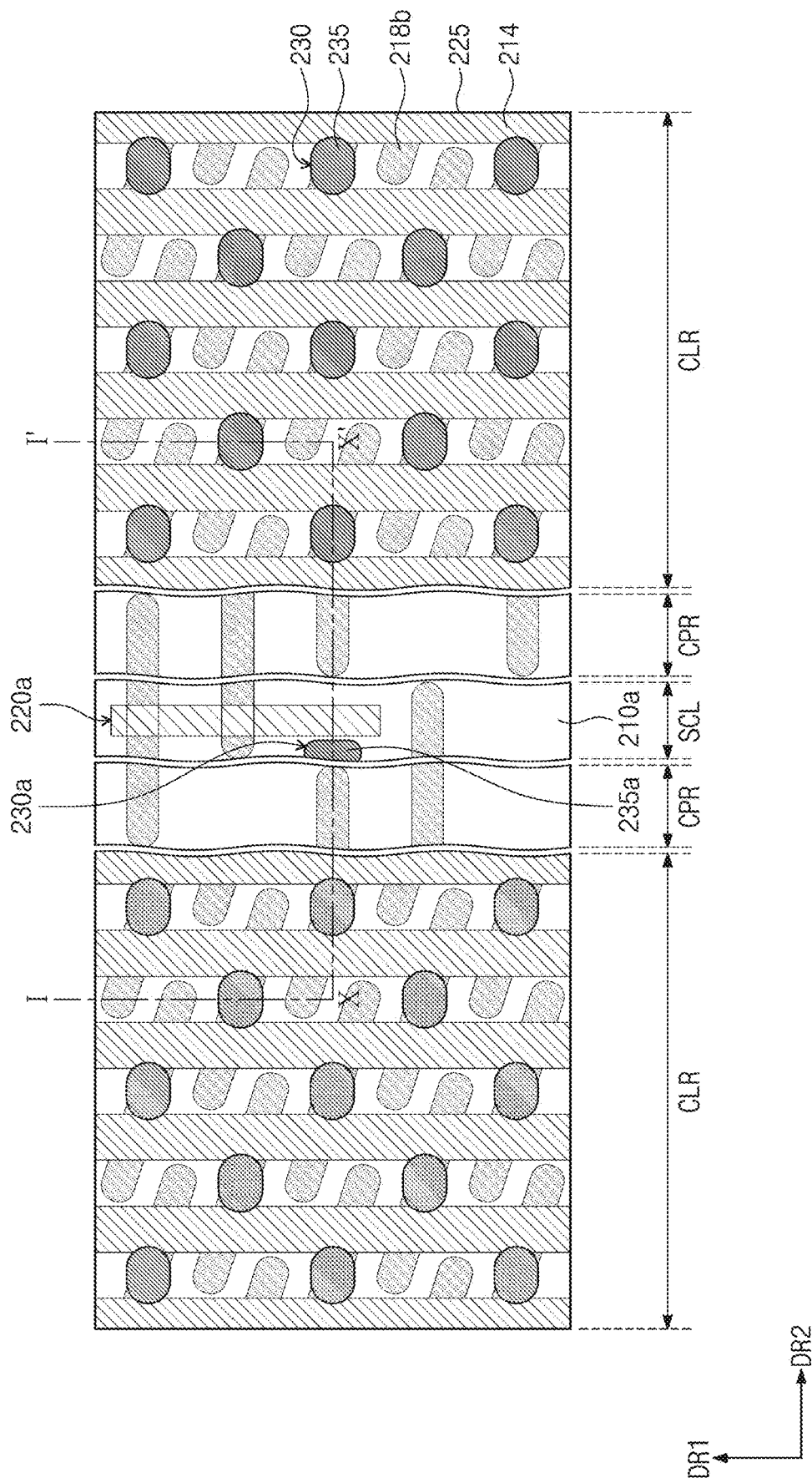

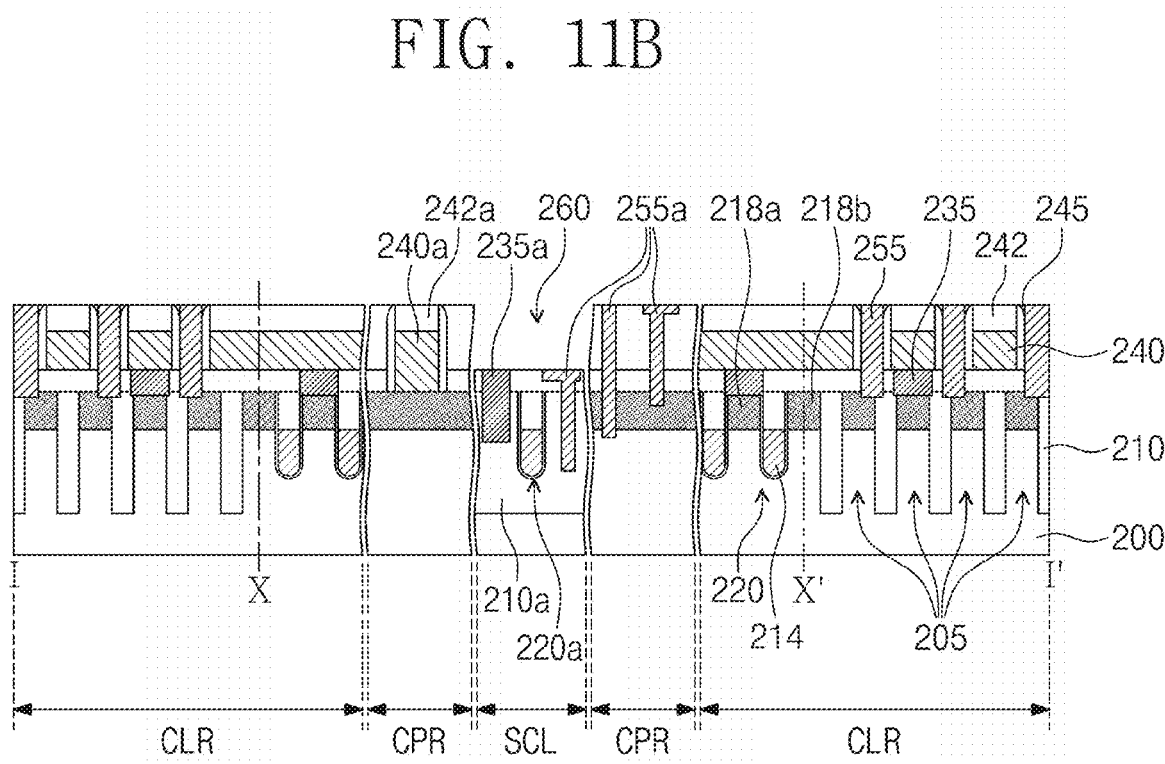

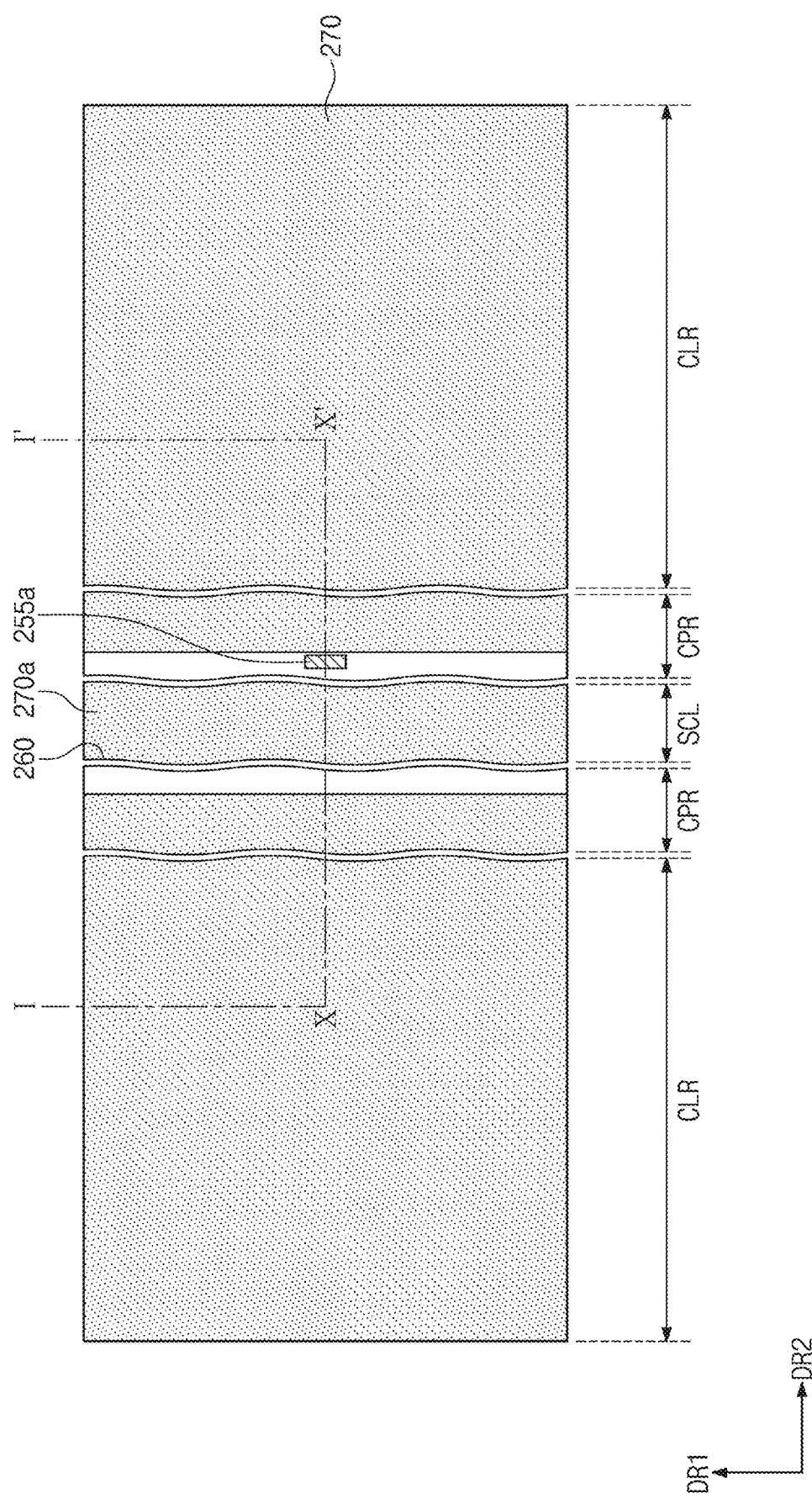

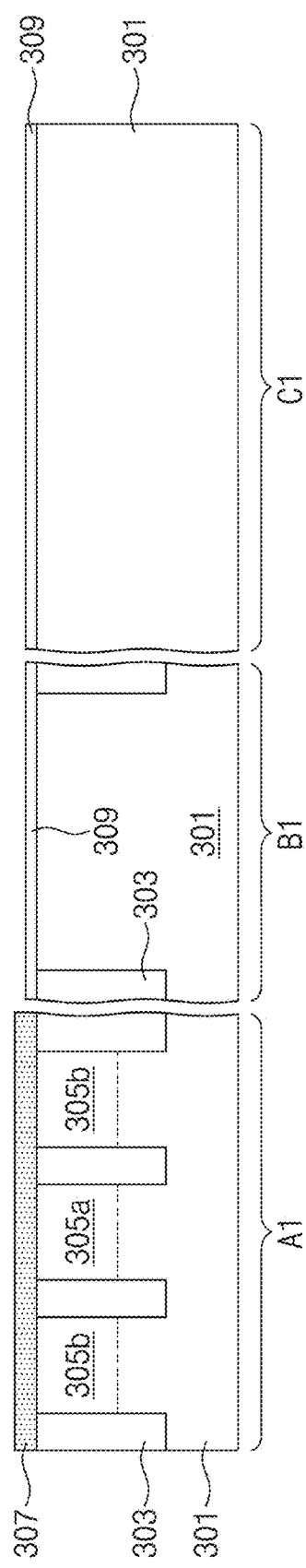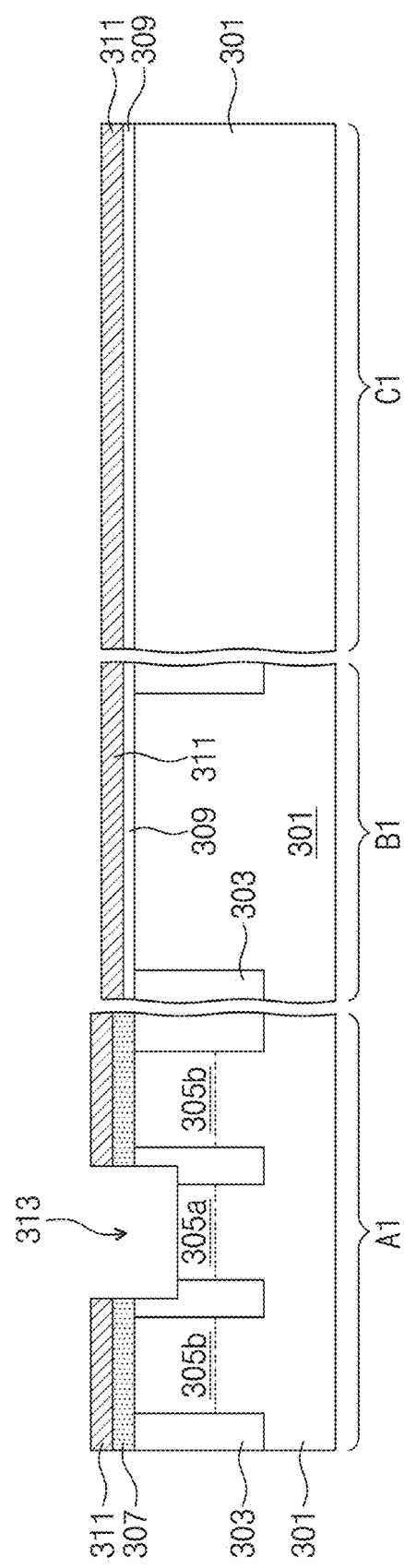

SEMICONDUCTOR DEVICE AND METHOD OF FABRICATING THE SAME

CROSS-REFERENCE TO RELATED PATENT APPLICATIONS

This is a Divisional of U.S. application Ser. No. 16/110,658, filed on Aug. 23, 2018, which is a Continuation in Part of U.S. application Ser. No. 15/093,033, filed on Apr. 7, 2016, which claims priority under 35 U.S.C. § 119 to Korean Patent Application No. 10-2015-0066801, filed on May 13, 2015, in the Korean Intellectual Property Office, the entire contents of each of which are hereby incorporated by reference.

BACKGROUND OF THE INVENTION

The present disclosure relates to a semiconductor device and a method of fabricating the same.

Due to their small-size, multifunctional, and/or low-cost characteristics, semiconductor devices are widely used as important elements in the electronic industry. With advances in the electronic industry, semiconductor devices are becoming more integrated. In some cases, increased integration of semiconductor devices may result in various technical issues. For example, as an integration density of semiconductor devices increase, patterns included in the semiconductor devices may have a decreasing line width and/or space and an increasing height and/or aspect ratio. In some cases, one or more of a such decreased line width and/or space and increasing height and/or aspect ratio of patterns of semiconductor devices may lead to one or more of an increased difficulties in a layer deposition process according to which semiconductor devices are at least partially fabricated, reduced uniformity in an etching process according to which semiconductor devices are at least partially fabricated, and deterioration in reliability of the fabricated semiconductor devices.

SUMMARY

Some embodiments of the inventive concept provide a highly reliable semiconductor device.

Some embodiments of the inventive concept provide a fabrication method of preventing a double stepwise structure from being formed before a polishing process.

According to some embodiments of the inventive concept, a semiconductor device may include a semiconductor substrate including a first region and a second region, a dummy separation pattern provided on the second region of the semiconductor substrate to have a recessed region at its upper portion, a first electrode provided on the first region of the semiconductor substrate, a dielectric layer covering the first electrode, a second electrode provided on the dielectric layer, and a remaining electrode pattern provided in the recessed region. The second electrode and the remaining electrode pattern may be formed of a same material.

According to some embodiments of the inventive concept, a semiconductor device may include a semiconductor substrate including a first region and a second region, a dummy separation pattern provided on the second region of the semiconductor substrate to have a recessed region at its upper portion, a remaining electrode pattern provided in the recessed region, and a through electrode provided to penetrate the interlayer insulating layer, the remaining electrode pattern, and the dummy separation pattern and to be extended into the semiconductor substrate. The remaining electrode pattern may be formed of a conductive layer.

According to some embodiments of the inventive concept, a semiconductor device may include a semiconductor substrate including a first region and a second region, landing pads provided on the first region of the semiconductor substrate and spaced apart from each other by a first space, first dummy pads provided on the second region of the semiconductor substrate and spaced apart from each other by a second space greater than the first space, a first electrode provided on the landing pads, a dummy separation pattern provided between the first dummy pads to have a recessed region at its upper portion, and a remaining electrode pattern filling the recessed region. The remaining electrode pattern may be formed of a conductive layer.

According to some embodiments of the inventive concept, a method of fabricating a semiconductor device may include preparing a semiconductor substrate including a first region and a second region, forming a dummy separation pattern, which has a recessed region at its upper portion, on the second region of the semiconductor substrate, forming a first electrode and a dielectric layer on the first region of the semiconductor substrate, forming a second electrode covering the dielectric layer and a remaining electrode pattern filling the recessed region, forming an interlayered insulating layer to cover the second electrode, the remaining electrode pattern, and the dummy separation pattern, and forming a through electrode to penetrate the interlayered insulating layer, the remaining electrode pattern, and the dummy separation pattern and to be extended into the semiconductor substrate. The second electrode and the remaining electrode pattern may be formed of the same material.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1, 2A, 2B, 2C, 3, and 4 are sectional views illustrating a method of fabricating a semiconductor device, according to some example embodiments of the inventive concepts.

FIGS. 6A, 7A, 8A, 9A, 10A, 11A, 12A, 13A, and 14A are plan views illustrating a semiconductor device, according to some example embodiments of the inventive concepts.

FIGS. 6B, 7B, 8B, 9B, 10B, 11B, 12B, 13B, and 14B are sectional views taken along lines I-I' of FIGS. 6A, 7A, 8A, 9A, 10A, 11A, 12A, 13A, and 14A, respectively.

FIGS. 17A, 17B, 17C, 17D, 17E, 17F, 17G, 17H, 17I, 17J, 17K, 17L, 17M, 17N, 17O, and 17P are sectional views illustrating a process of fabricating a semiconductor device, according to some example embodiments of the inventive concept.

Figure 2A:
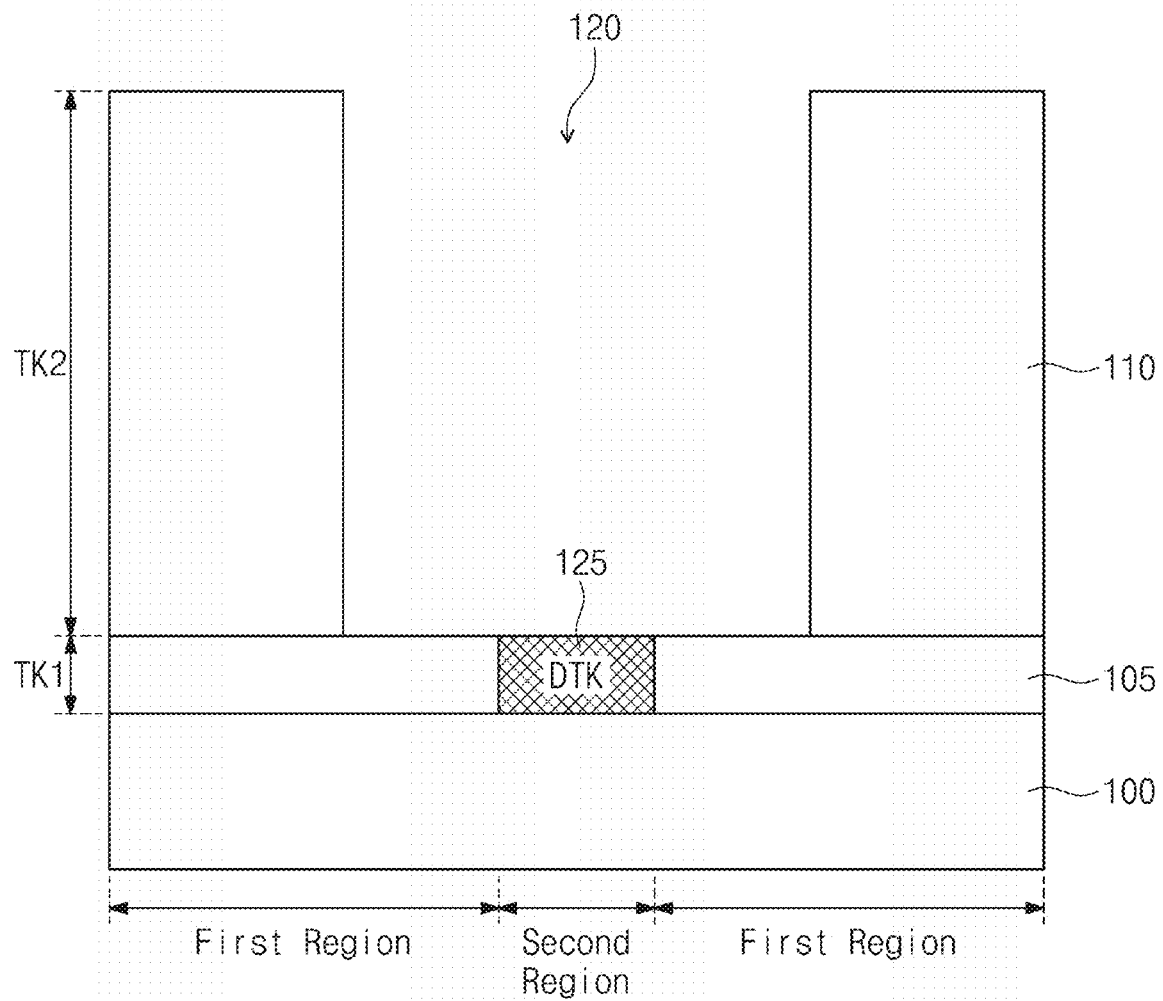

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

FIGS. 1, 2A, 2B, 2C, 3, and 4 are sectional views illustrating a method of fabricating a semiconductor device, according to some example embodiments of the inventive concepts.

Referring to FIG. 1, a substrate 100 may be provided. The substrate 100 may include a pair of first regions and a second region provided between the pair of first regions.

First patterns 105 may be formed on the first regions of the substrate 100, respectively, and second patterns 110 may be formed on the first patterns 105, respectively, to expose at least a portion of each of the first patterns 105.

In more detail, the formation of the first patterns 105 may include forming a first layer (not shown) having a first thickness TK1 on the first and second regions of the substrate 100 and patterning the first layer to expose the second region of the substrate 100. The second region may include a first opening 115 that is defined by the substrate 100 and the first patterns 105. The first opening 115 may have a depth that is substantially equal to the first thickness TK1, greater than the first thickness TK1, or smaller than the first thickness TK1.

In some example embodiments, the first opening 115 may have a line-shaped structure extending in a specific direction. Alternatively, the first opening 115 may have a hole-shaped structure. However, the first opening 115 may not be limited to the line-shaped structure or hole-shaped structure.

The formation of the second patterns 110 may include forming a second layer (not shown) on the substrate 100 provided with the first patterns 105 to have a second thickness TK2 greater than the first thickness TK1, and patterning the second layer to expose at least a portion of the first patterns 105 and the second region of the substrate 100. Accordingly, a second opening 120, which is connected to the first opening 115 and is defined by the first patterns 105 and the second patterns 110, may be formed on the first opening 115. The second opening 120 may have a depth that is substantially equal to the second thickness TK2.

Although not shown, in some example embodiments, at least one additional layer may be inserted between the first pattern 105 and the second pattern 110.

As shown in FIG. 1, the substrate 100 and the first and second patterns 105 and 110 may be formed to define two stepwise portions. For example, the two stepwise portions may be formed between the substrate 100 and the first pattern 105 and between the first pattern 105 and the second pattern 110.

Figure 2B:
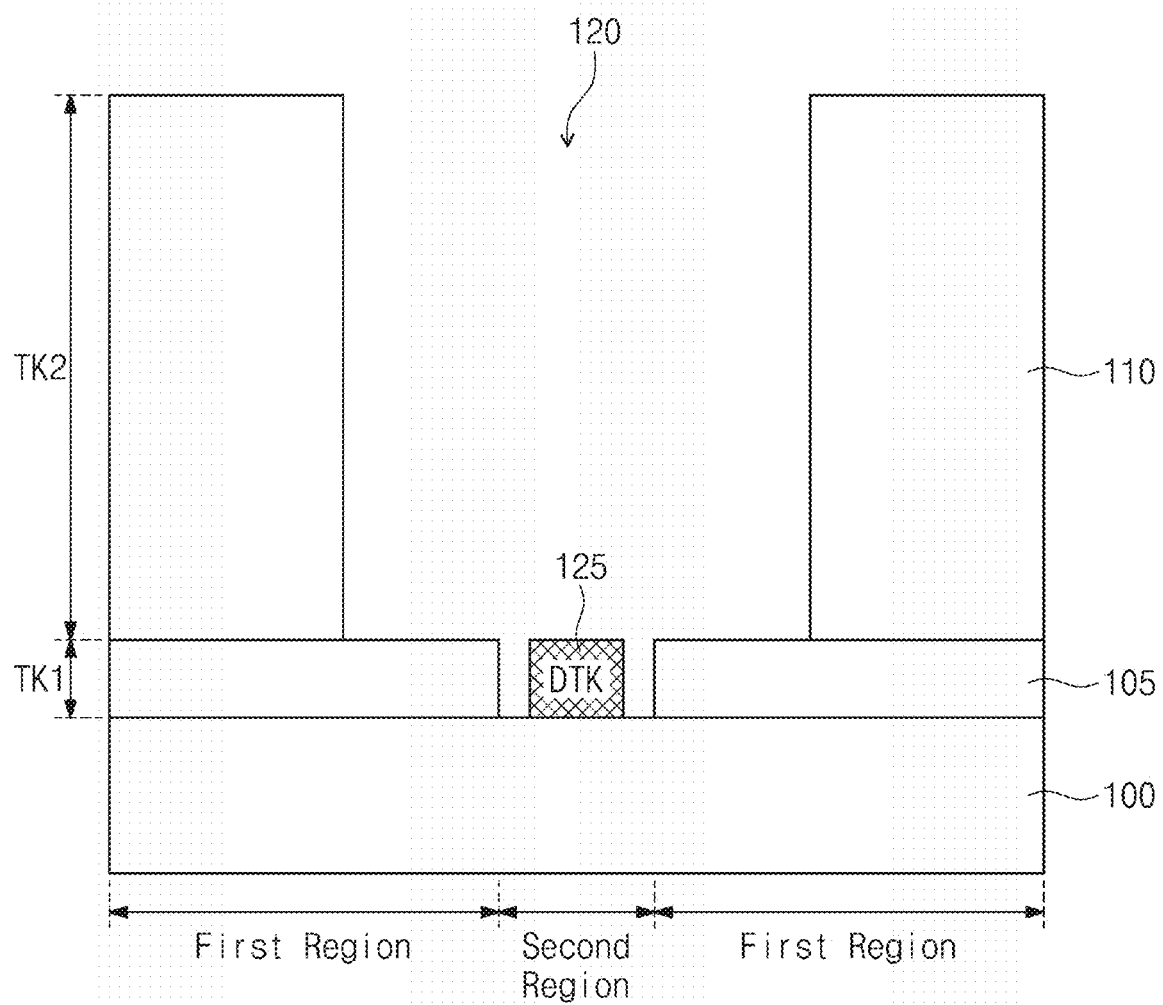

Referring to FIGS. 2A, 2B, and 2C, a dummy pattern 125 may be formed on the second region of the substrate 100 to fill at least a portion of the first opening 115.

The dummy pattern 125 may be formed in at least one (e.g., a lower one) of the two stepwise portions. The dummy pattern 125 may enable reduction of a height difference of the semiconductor device as a result of the dummy pattern at least partially filling at least one of the two stepwise portions. The dummy pattern 125 may have a thickness DTK that is substantially equal to or greater than the first thickness TK1, greater than the first thickness TK1, or smaller than the first thickness TK1.

According to some example embodiments shown in FIG. 2A, the dummy pattern 125 may be formed to completely cover or fill the first opening 115. The dummy pattern 125 may have the same or similar structure to the first opening 115. According to some example embodiments shown in FIG. 2B, the dummy pattern 125 may be formed to partially cover or fill the first opening 115. The dummy pattern 125 may have a different structure from the first opening 115. For example, the dummy pattern 125 may have a patterned structure (e.g., shaped like a contact plug) provided in the first opening 115. According to another example embodiment shown in FIG. 2C, the dummy pattern 125 may be formed to completely cover or fill the first opening 115 and partially cover a portion of the first pattern 105 adjacent to the first opening 115.

In some example embodiments, the dummy pattern 125 may be formed at the same time when the second pattern 110 is formed. In some example embodiments, the dummy pattern 125 may be formed of or include substantially the same material as the second pattern 110, such that the dummy pattern 125 and the second pattern 110 include substantially common materials.

As shown, the dummy pattern 125 may be an electrically floating structure. For example, the dummy pattern 125 may not be electrically or physically connected to any other conductive structure. Furthermore, the dummy pattern 125 may be formed of or include a conductive or insulating material.

Figure 3:
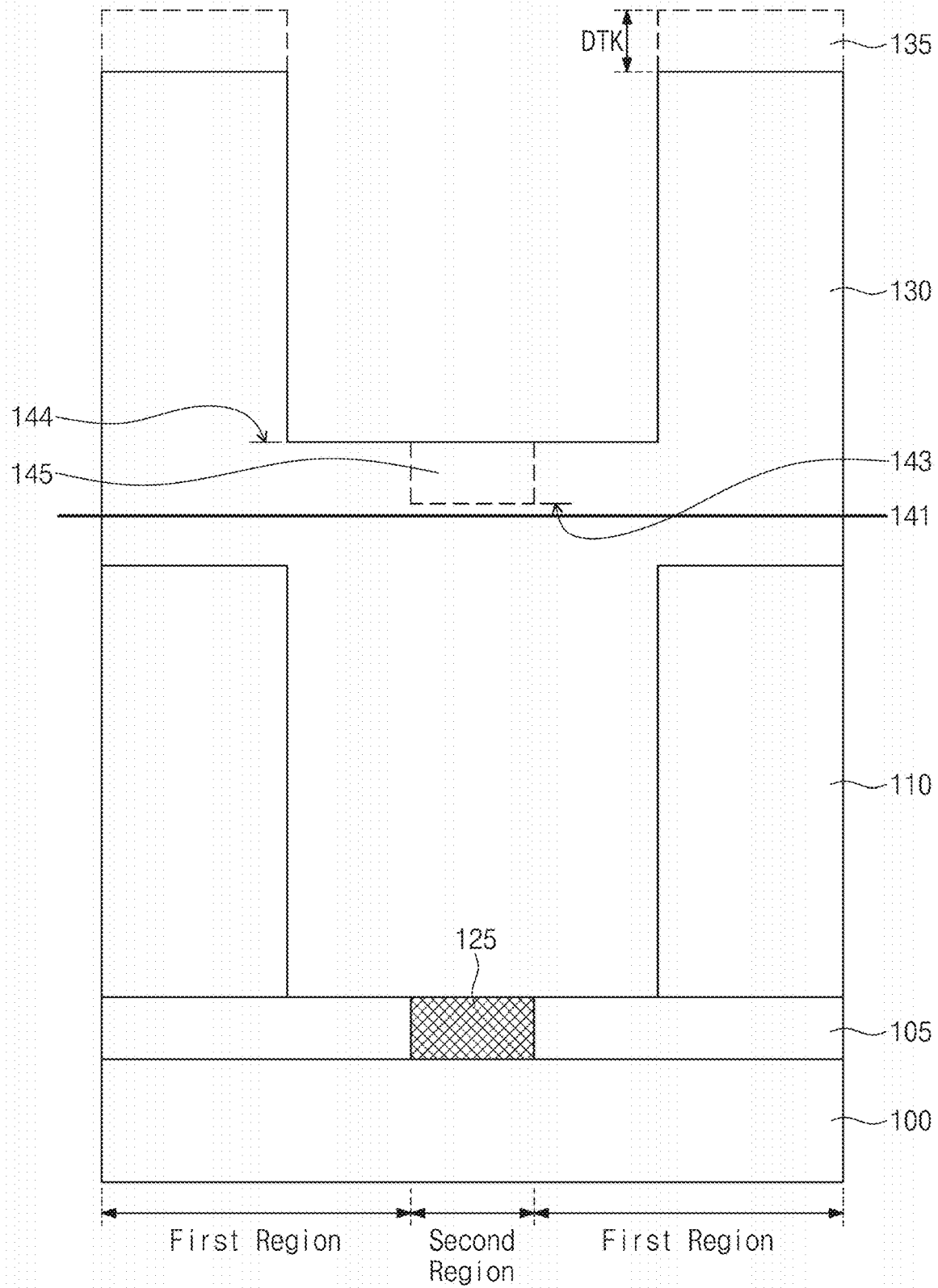
Figure 4:
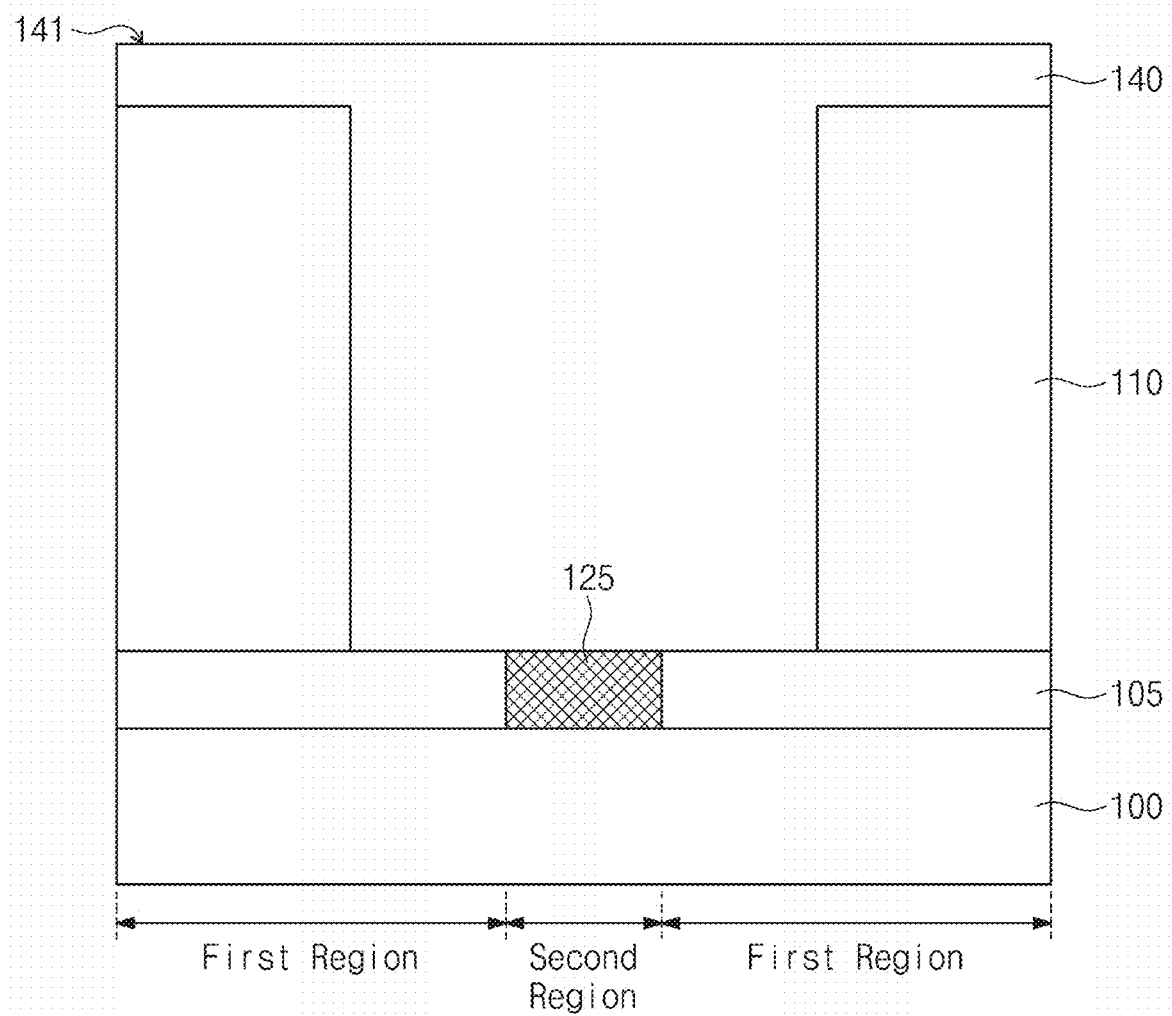

Referring to FIGS. 3 and 4, a third layer 130 may be formed on the substrate 100 to fill the second opening 120 provided with the dummy pattern 125, and an upper portion of the third layer 130 may be polished to form a third pattern 140 having a surface 141 (see FIG. 4) and covering the first and second patterns 105 and 110.

Where the dummy pattern 125 is provided, a stepwise portion 145 may be omitted from the third layer 130. A third pattern 130 including a sufficient thickness to enable the third pattern 140 (see FIG. 4) to have a desired polishing surface 141 may have a lowest surface that is greater in height than the desired polishing surface 141. Where stepwise portion 145 is omitted from the third layer 130, the lowest surface of the third layer 130 may be surface 144, rather than the lower surface 143 of the stepwise portion 145. Thus, the thickness of the third layer 130 may be reduced by a height DTK (e.g., the first thickness TK1) of the dummy pattern 125, so that the surface 144 is at the height of surface 143 above the height of the desired polishing surface 141 shown in FIG. 3. Namely, a portion 135 of the third layer 130 may be eliminated from formation.

Elimination of the portion 135 from formation may result in a reduced formation of the third layer 130. A reduced formation of the third layer 130 may result in a decrease in a cost of forming the third layer 140 (see FIG. 4). In addition, because the stepwise portion 145 may be omitted from the third layer 130 as a result of the dummy pattern 125 being provided, the resulting profile of the third layer may have fewer stepwise portions. Such a reduction in stepwise portions in the profile of the third layer 130 may result in an improved thickness uniformity of the polishing process to establish a desired polishing surface 141.

In some example embodiments, where the first opening 115 is filled with the dummy pattern 125, the number ("quantity") of the stepwise portions defined between the substrate 100 and the first and second patterns 105 and 110 may be reduced, as at least one stepwise portion may be at least partially filled by the dummy pattern 125. As a result, a height that the third layer 130 is formed may be reduced, as a corresponding stepwise portion 145 in the third layer 130 may be omitted. Because the corresponding stepwise portion 145 in the third layer 130 may be omitted, as shown in FIG. 3, the height of the third layer 130 that at least uniformly reaches the target height of a polished surface 141 may be less (by thickness DTK as shown in FIG. 3) than if the stepwise portion 145 were not omitted. This may make it possible to improve thickness uniformity of the polishing process, based at least in part upon the reduced amount or portion 135 of the third layer 130 to be polished to establish a uniform surface 141, as shown in FIG. 4.

Hereinafter, a dynamic random access memory (DRAM) device will be described as an example of the semiconductor device. But example embodiments of the inventive concepts may not be limited to the example, in which the DRAM device is the semiconductor device.

Figure 5:
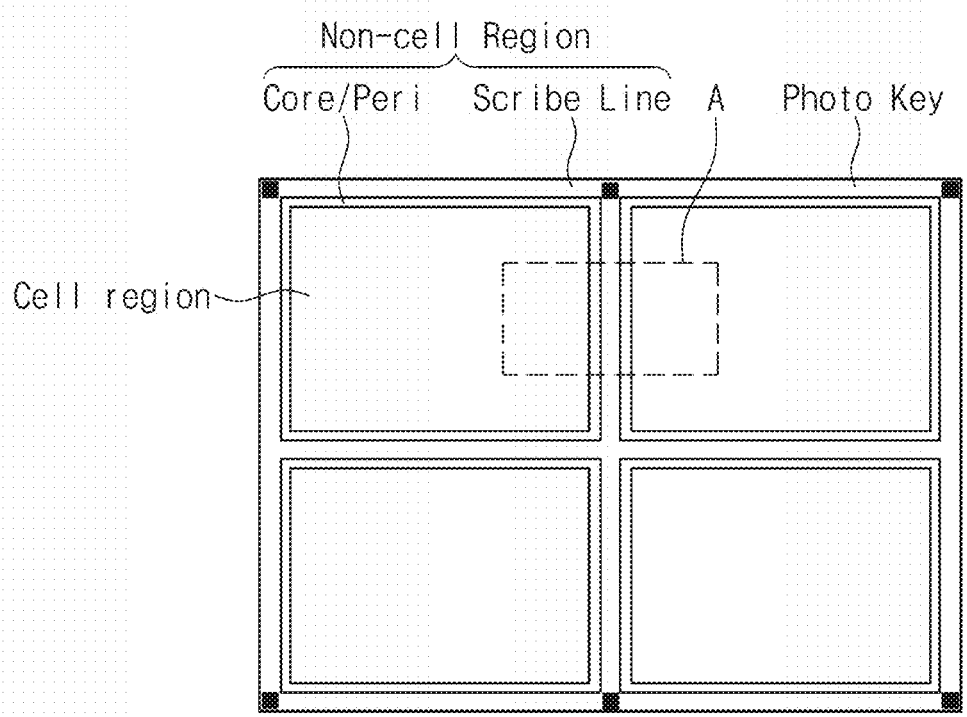
FIG. 5 is a block diagram illustrating a conventional semiconductor device, according to some example embodiments of the inventive concepts.

FIG. 5 is a block diagram illustrating a conventional semiconductor device.

Referring to FIG. 5, a semiconductor device may include a cell region provided with memory cells and a non-cell region provided around the cell region. The non-cell region may be provided to surround the cell region and may include a core/peripheral region, which is configured to enable electrical signal transmission from/to the memory cells, and a scribe line defining a plurality of cell regions.

In some example embodiments, the scribe line may serve as a sawing line for cutting or dividing the cell regions of the semiconductor device into unit chips. Furthermore, auxiliary structures, such as a photo key, an electrical test pattern, and a measurement site, may be provided on the scribe line. The photo key may be used as, for example, a pattern for aligning it with an underlying structure, when a photolithography process is performed to form a plurality of structures on the cell regions. The electrical test pattern may be used to measure an electrical signal associated with each or some of layers of the semiconductor device, during a process of forming a plurality of structures on the cell regions. The measurement site may be used to measure physical or optical properties (e.g., a layer thickness) of each or some of the layers, in a process of forming a plurality of structures on the cell regions.

Hereinafter, a method of fabricating a semiconductor device will be exemplarily described with reference to the portion A of FIG. 5.

FIGS. 6A, 7A, 8A, 9A, 10A, 11A, 12A, 13A, and 14A are plan views illustrating a semiconductor device according to some example embodiments of the inventive concepts, and FIGS. 6B, 7B, 8B, 9B, 10B, 11B, 12B, 13B, and 14B are sectional views taken along lines I-I' of FIGS. 6A, 7A, 8A, 9A, 10A, 11A, 12A, 13A, and 14A, respectively.

Figure 6B:
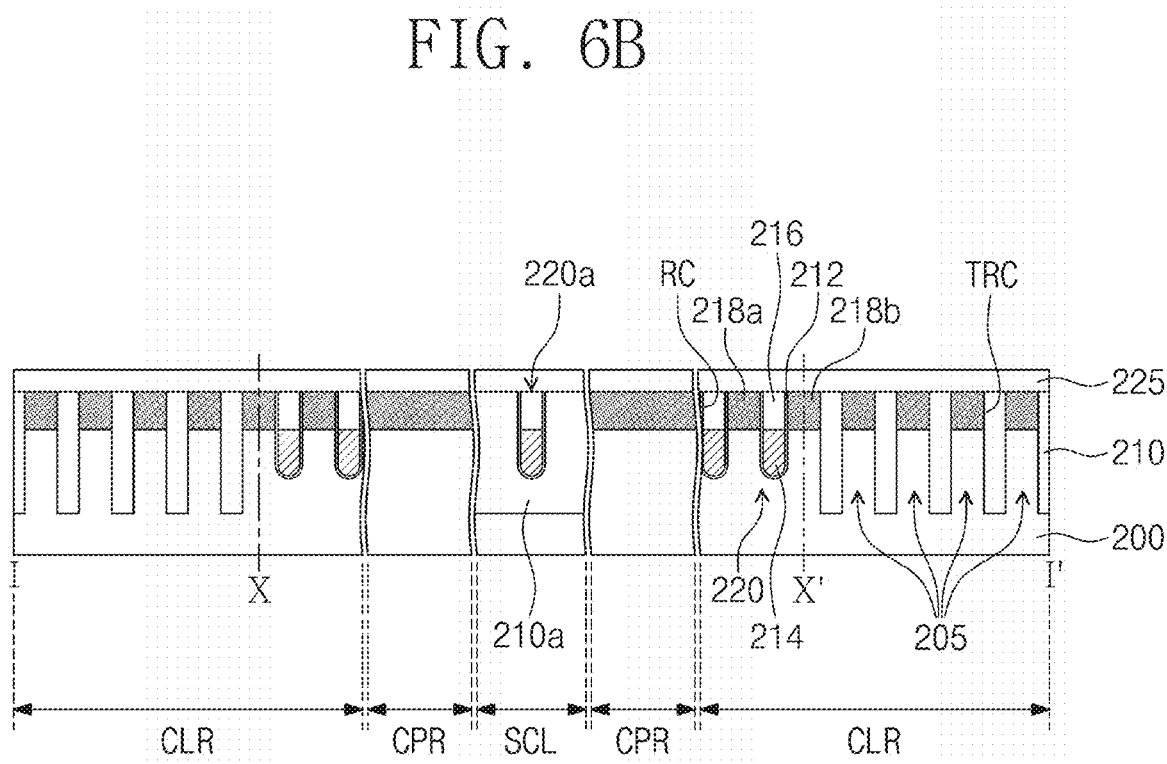

Referring to FIGS. 6A and 6B, a device isolation pattern 210 may be formed on a substrate 200 including cell regions CLR and a non-cell region to define active patterns 205, and cell transistors 220 may be formed on the cell regions CLR.

In more detail, the substrate 200 may be etched to form a trench TRC, and the trench TRC may be filled with an insulating layer (e.g., of silicon oxide, silicon nitride, and silicon oxynitride) to form the device isolation pattern 210. Next, the substrate 200 may be etched to form recesses RC. The recesses RC may be formed to cross the active patterns 205 defined by the device isolation pattern 210 and may be parallel to each other. A gate insulating layer 212 may be formed in the recesses RC, and gate electrodes 214 may be formed to fill lower portions of the recesses RC provided with the gate insulating layer 212. The gate insulating layer 212 may be formed of or include at least one of silicon oxide or high-k metal oxides (e.g., hafnium oxide or aluminum oxide). The gate electrode 214 may be formed of or include at least one of doped silicon, metals (e.g., tungsten or copper), or metal compounds (e.g., titanium nitride or tungsten nitride). In addition, each of the gate electrodes 214 may extend in a first direction DR1. For example, a pair of gate electrodes 214 may be formed to cross each of the active patterns 205. First capping patterns 216 may be formed on the gate electrodes 214, respectively, to fill upper portions of the recesses RC. Each of the first capping patterns 216 may be formed of or include an insulating material (e.g., silicon oxide, silicon nitride, and silicon oxynitride). First and second impurity regions 218a and 218b may be formed in portions of the active patterns 205 exposed by each of the first capping patterns 216. The first and second impurity regions 218a and 218b may be formed via injecting impurities into the portions of the active patterns 205 exposed by each of the first capping patterns 216. The cell transistors 220 may be formed in such a way that channel regions thereof are positioned below a top surface of the substrate 200; that is, the cell transistors 220 may have a structure called a buried channel array transistor (BCAT).

Thereafter, a first interlayered insulating layer 225 may be formed on the substrate 200 to cover the cell transistor 220. The first interlayered insulating layer 225 may be formed of or include an insulating material (e.g., silicon oxide, silicon nitride, and silicon oxynitride). After the formation of the first interlayered insulating layer 225, a polishing process may be performed to polish a top surface of the first interlayered insulating layer 225.

When the cell transistors 220 and the first interlayered insulating layer 225 are formed on the cell regions CLR, a first structure 210a resembling the device isolation pattern 210 and a second structure 220a resembling the cell transistor 220 may be respectively formed in a core/peripheral region CPR and a scribe line SCL. Here, the expression "resembling" means that the first and second structures 210a and 220a include the same materials as the device isolation pattern 210 and the cell transistor 220 but are different from the device isolation pattern 210 and the cell transistor 220 in terms of their structures or positions. Although a detailed description will be omitted, the first and second structures 210a and 220a may have a variety of structures. The first and second structures 210a and 220a may not be formed in the core/peripheral region CPR and the scribe line SCL or may be formed in a portion thereof.

Figure 7B:
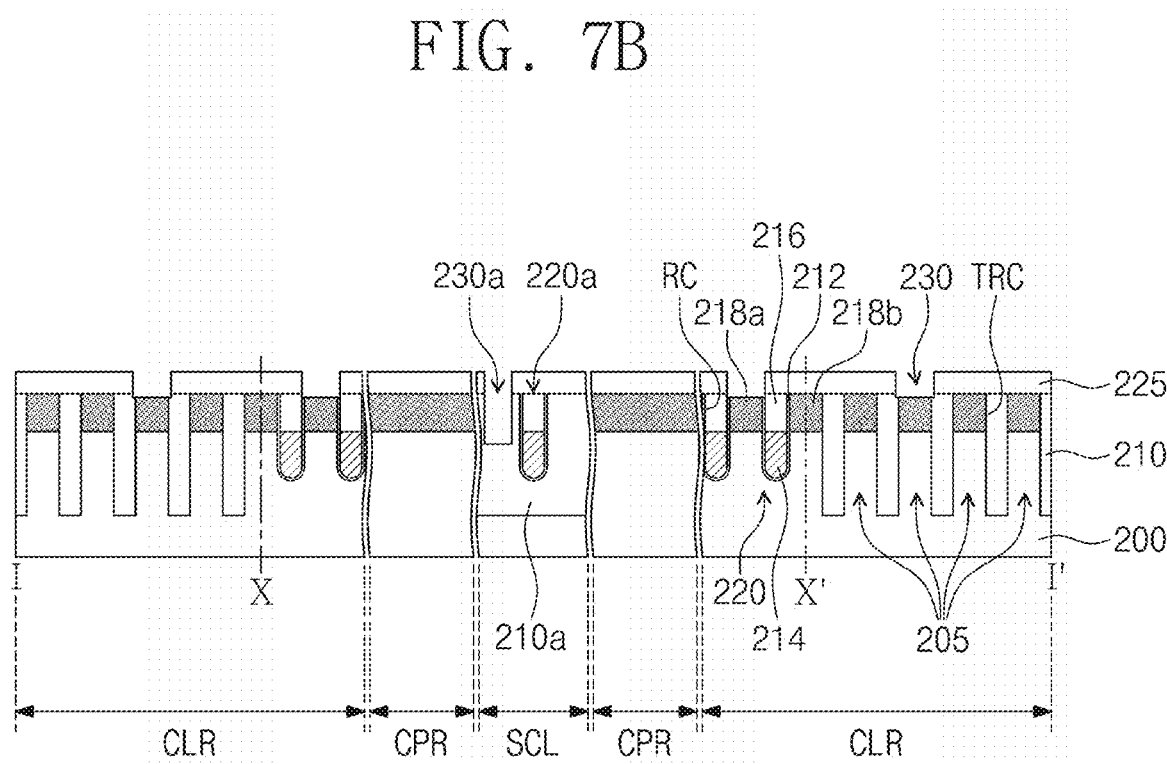

Referring to FIGS. 7A and 7B, the first interlayered insulating layer 225 may be patterned to form first contact holes 230 exposing the first impurity regions 218a, respectively.

In some example embodiments, when a photolithography process using a mask (not shown) is performed to form the first contact holes 230 on the cell region CLR, the photo key formed on the scribe line SCL (e.g., see FIG. 5) may be opened or exposed before the photolithography process, so as to allow the mask to be aligned with the photo key. The first and second structures 210a and 220a may be exposed when the photo key on the scribe line SCL is opened. For example, in the case where the first interlayered insulating layer 225 includes oxide and the first structure 210a resembling the device isolation pattern 210 includes a material (e.g., oxide) similar to that of the device isolation pattern 210, an exposed portion of the first structure 210a may be etched in the process of forming the first contact hole 230, and as a result, the first opening 230a may be formed on the scribe line SCL.

As shown in FIGS. 7A and 7B, the first opening 230a may be formed to have a hole-shaped structure, but in some example embodiments, when viewed in plan view, the first opening 230a may have a line-shaped or patterned structure extending in a specific direction or various structures (e.g., circular, elliptical, or polygonal structures).

In some example embodiments, the first opening 230a on the scribe line SCL may be formed during the photolithography process, but in some example embodiments, the first opening 230a may be formed when the auxiliary structures (e.g., electrical test patterns or measurement sites) for testing the structures of FIGS. 7A and 7B are exposed. Furthermore, the first opening 230a may be formed on not only the scribe line SCL but also the core/peripheral region CPR.

Figure 8B:
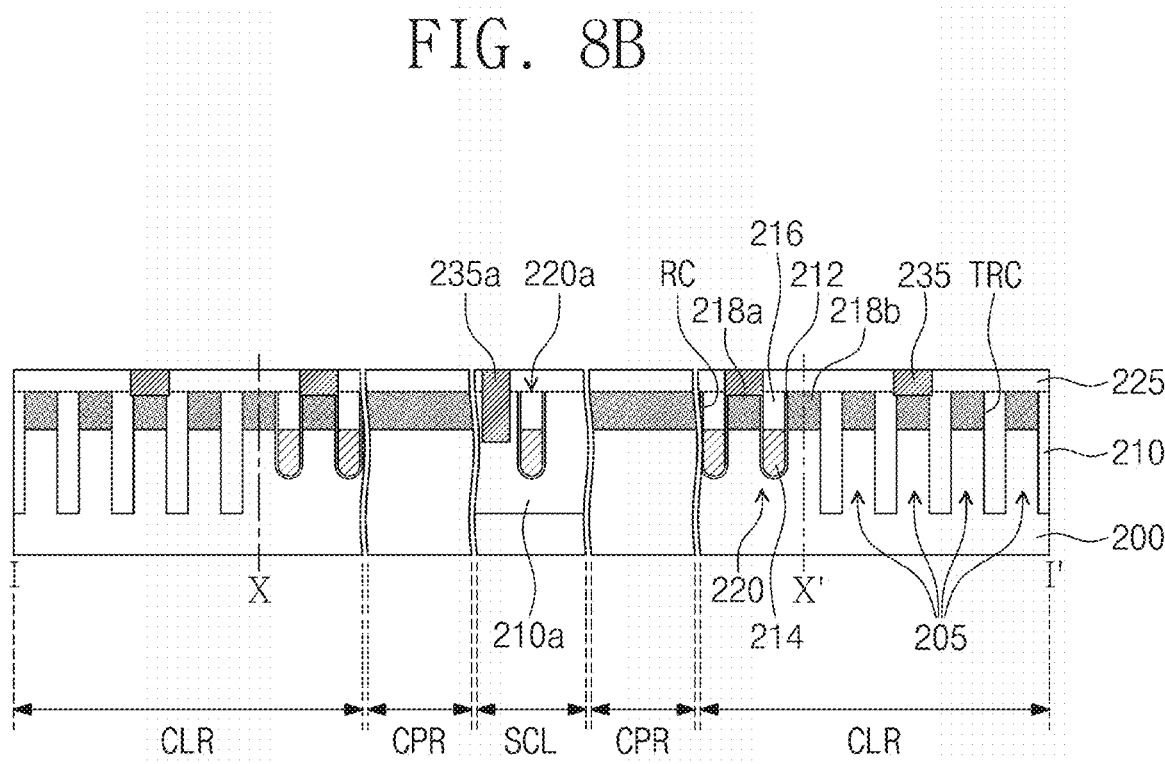

Referring to FIGS. 8A and 8B, the first contact holes 230 may be filled with a first conductive material to form first contact plugs 235 electrically coupled to the first impurity regions 218a. The first conductive material may include at least one of doped silicon, metals (e.g., tungsten or copper), or metal compounds (e.g., titanium nitride or tungsten nitride).

In some example embodiments, when the first contact holes 230 are filled with the first conductive material, the first opening 230a may also be filled with the first conductive material to form a first dummy pattern 235a. The first dummy pattern 235a may be in an electrically floating state. In other words, the first dummy pattern 235a may be electrically and physically isolated from any other conductive structure. When the first dummy pattern 235a is electrically or physically connected to other structure, the other structure may be in an electrically floating state.

In some example embodiments, at least a portion of the first opening 230a may be filled with the first conductive material and may have an empty structure.

According to some example embodiments, the first dummy pattern 235a may be formed to completely fill the first opening 230a and have the same structure as the first opening 230a. According to some example embodiments, the first dummy pattern 235a may be formed to partially cover or fill the first opening 230a to have a structure smaller than or different from the first opening 230a. For example, the first dummy pattern 235a may have a patterned structure or a contact plug structure. According to some example embodiments, the first dummy pattern 235a may be formed to cover or fill the first opening 230a and to partially cover the first interlayered insulating layer 225, and thus, the first dummy pattern 235a may have a structure greater than or different from the first opening 230a.

Figure 9A:
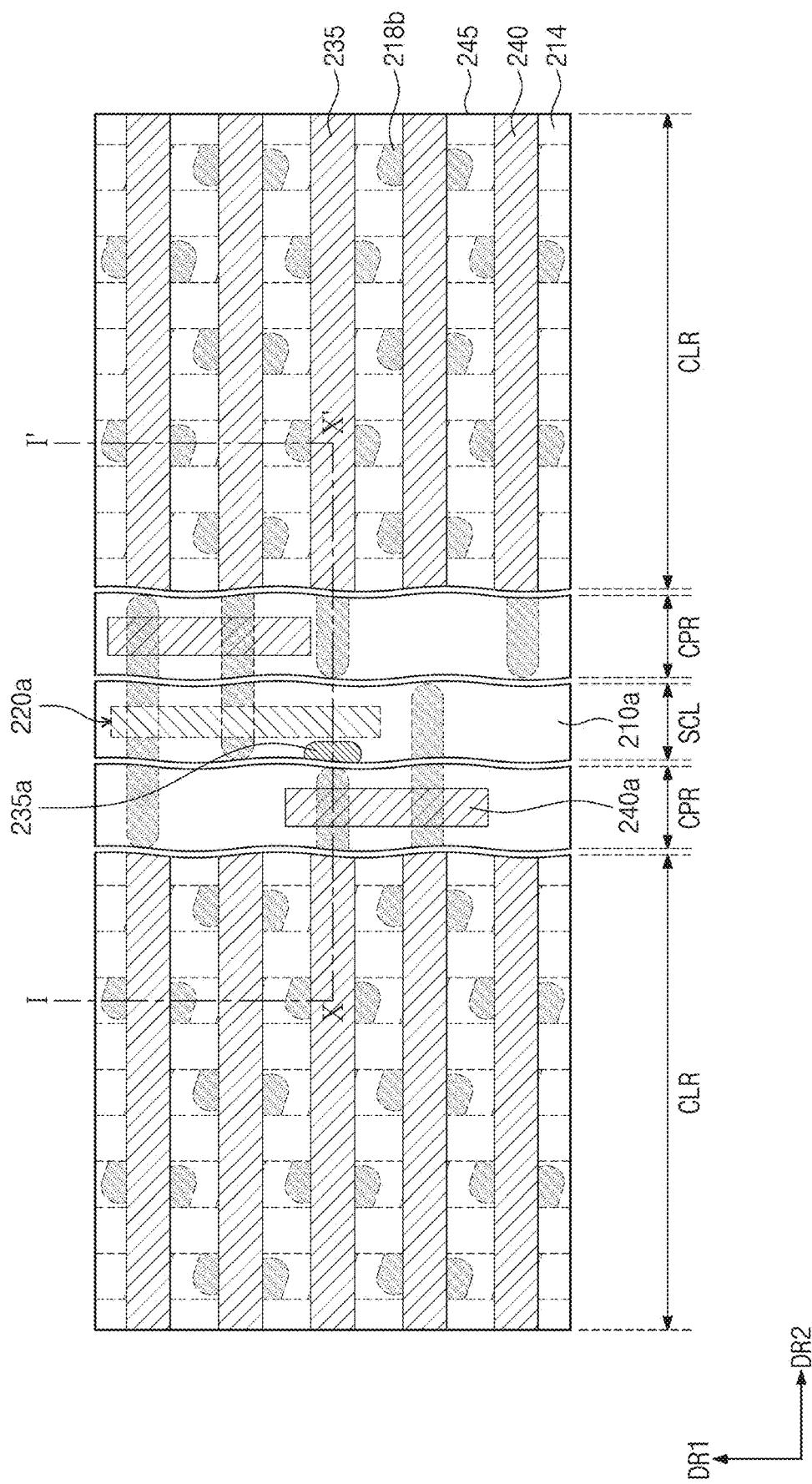
Figure 9B:
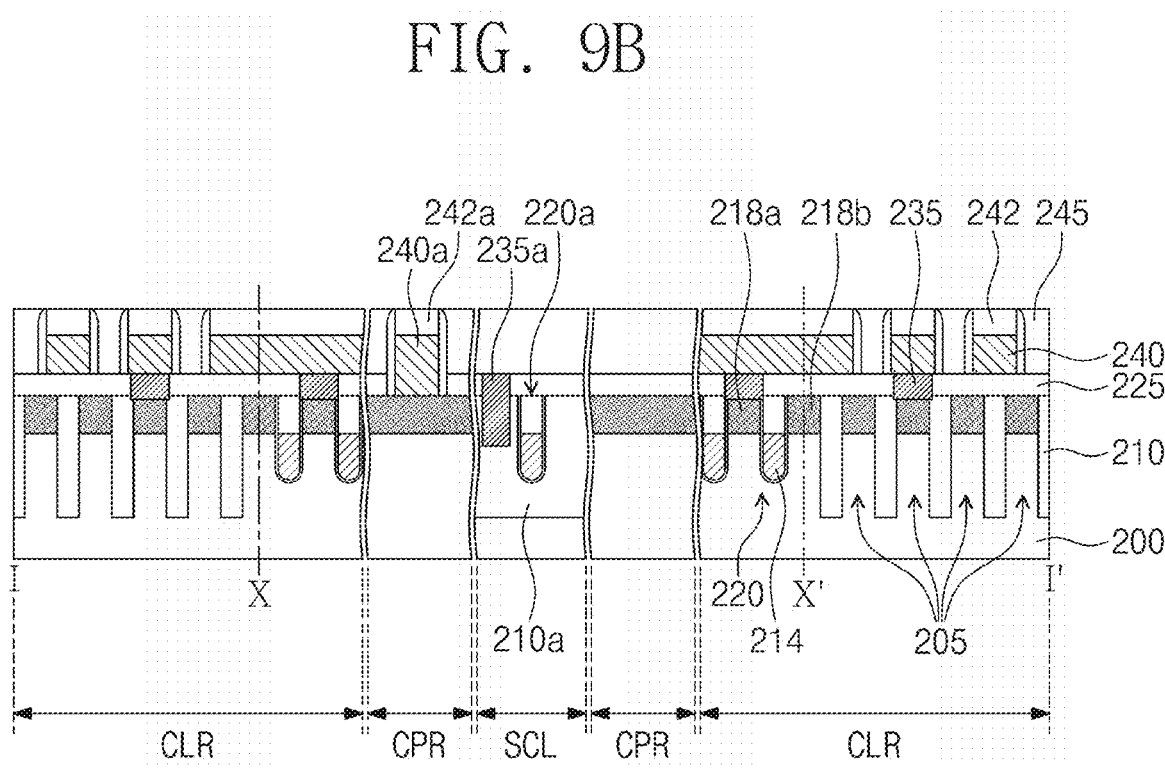

Referring to FIGS. 9A and 9B, bit line structures electrically coupled to the first contact plugs 235 may be formed on the cell regions CLR and a core/peripheral gate electrode structure may be formed on the core/peripheral region CPR. The bit line structures may electrically couple the first contact plugs 235 to each other.

In more detail, a first conductive layer (not shown) and a mask layer (not shown) may be sequentially formed on the first interlayered insulating layer 225. The first conductive layer may be formed of or include at least one of doped silicon, metals (e.g., tungsten or copper), or metal compounds (e.g., titanium nitride or tungsten nitride). In the case where the first opening 230a is not filled with the first conductive material of the first contact plug 235, the first conductive layer may be formed to fill the first opening 230a, and thus, the first dummy pattern 235a may be formed in the first opening 230a. The first dummy pattern 235a may be in an electrically floating state. The first dummy pattern 235a may be formed to have the same structure as that described with reference to FIGS. 8A and 8B, and in order to avoid redundancy, a detailed explanation of the first dummy pattern 235a is omitted.

Next, the first mask layer and the first conductive layer may be patterned by a photolithography process using a mask, to form the bit line structure and the core/peripheral gate electrode structure. Here, the bit line structure may include second capping patterns 242 and bit lines 240, and the core/peripheral gate electrode structure may include a core/peripheral capping pattern 242a and a core/peripheral gate electrode 240a.

As shown in FIG. 9A, the bit lines 240 may be formed parallel to a second direction DR2 perpendicular to the first direction DR1 and may be parallel to each other, on the cell regions CLR. In some example embodiments, the gate electrode structure and the bit line structures are formed on the core/peripheral region CPR and the cell regions CLR, respectively, but a structure corresponding to the gate electrode structure or the bit line structure may not be formed on the scribe line SCL.

A second interlayered insulating layer 245 may be formed on the substrate 200 to cover the bit line structure, the core/peripheral gate electrode structure, and the scribe line SCL. The second interlayered insulating layer 245 may be formed of or include an insulating material (e.g., silicon oxide, silicon nitride, and silicon oxynitride).

Figure 10A:
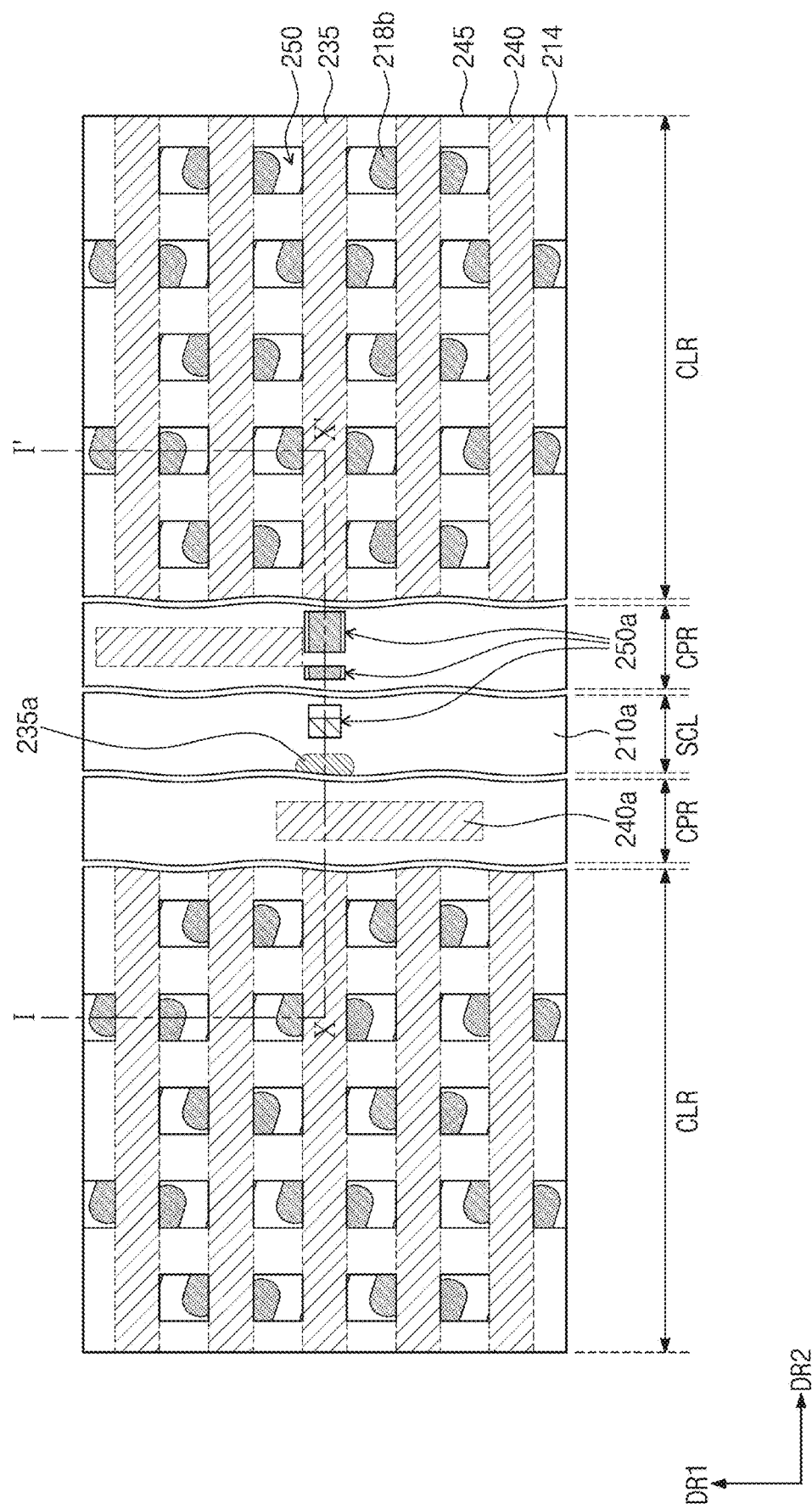
Figure 10B:
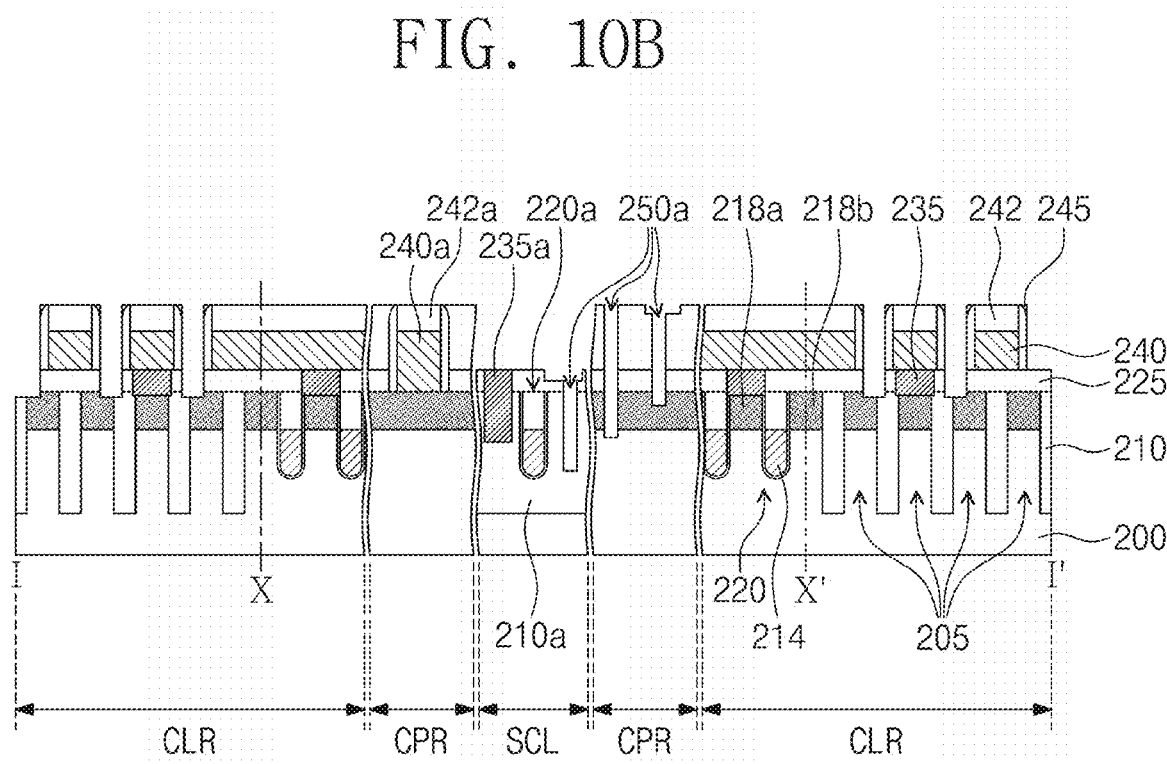

Referring to FIGS. 10A and 10B, the second interlayered insulating layer 245 and the first interlayered insulating layer 225 may be patterned to form second contact holes 250 exposing the second impurity regions 218b, respectively. The second contact holes 250 may be formed on the cell region CLR.

In some example embodiments, when a photolithography process using a mask (not shown) is performed to form the second contact holes 250 on the cell region CLR, the photo key formed on the scribe line SCL (e.g., see FIG. 5) may be opened or exposed before the photolithography process, so as to allow the mask to be aligned with the photo key. The first and second structures 210a and 220a on the scribe line SCL and the core/peripheral region CPR may be exposed, when the photo key on the scribe line SCL is opened. For example, in the case where the second interlayered insulating layer 245 includes oxide and the first structure 210a resembling the device isolation pattern 210 includes a material (e.g., oxide) similar to that of the device isolation pattern 210, an exposed portion of the first structure 210a may be etched in the process of forming the second contact hole 250, and as a result, the second openings 250a may be formed on the scribe line SCL and the core/peripheral region CPR. The second openings 250a may have a variety of differing sectional shapes.

As shown in FIGS. 10A and 10B, each of the second openings 250a may be formed to have a hole-shaped structure, but in some example embodiments, when viewed in a plan view, each of the second openings 250a may have a line-shaped structure extending in a specific direction or various structures (e.g., circular, elliptical, or polygonal structures).

In some example embodiments, the second openings 250a on the scribe line SCL and the core/peripheral region CPR may be formed during the photolithography process, but in some example embodiments, the second openings 250a may be formed when the auxiliary structures (e.g., electrical test patterns or measurement sites) for testing the structures of FIGS. 10A and 10B are exposed.

Figure 11A:
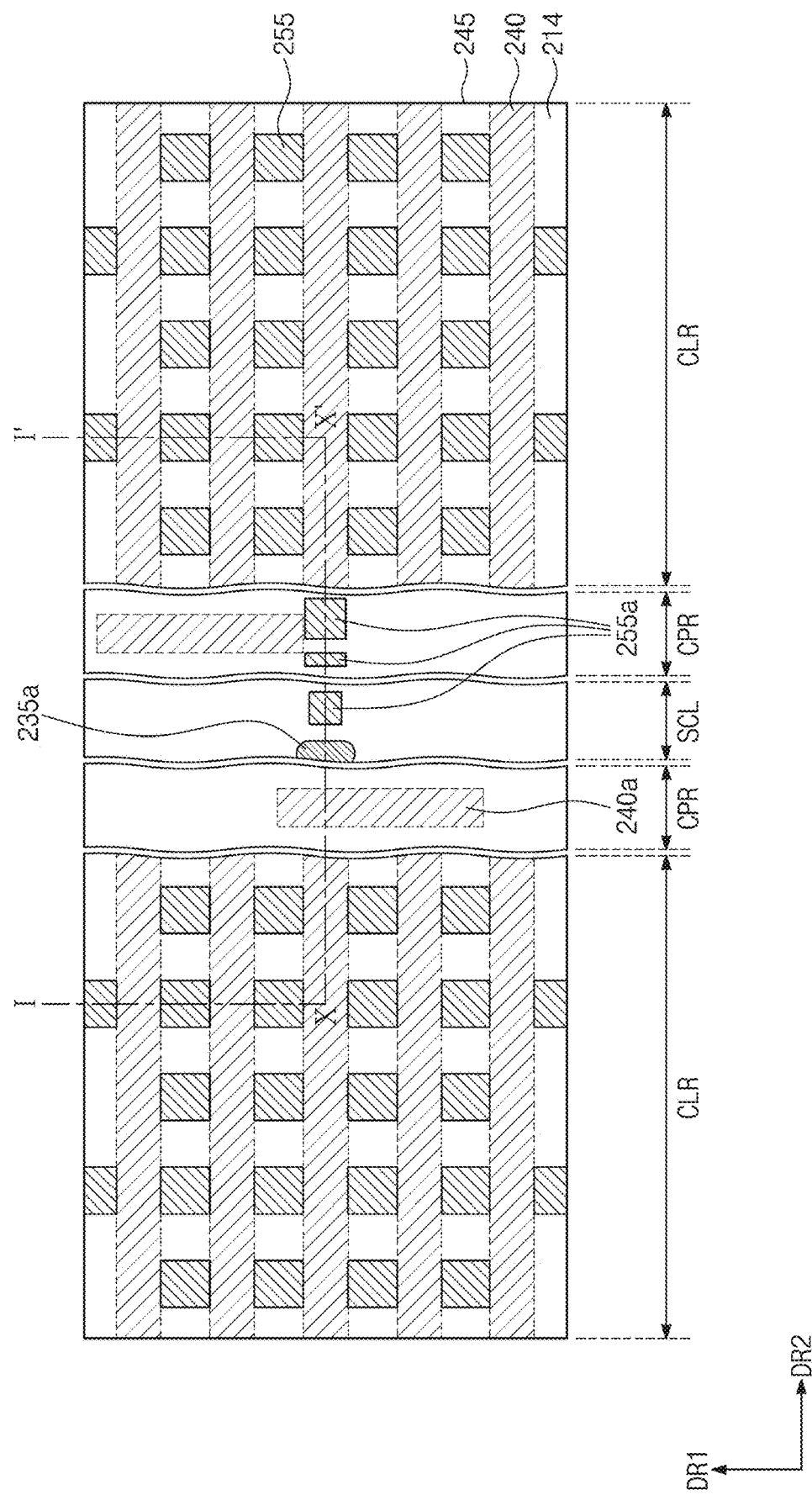

Referring to FIGS. 11A and 11B, the second contact holes 250 may be filled with a second conductive material to form second contact plugs 255 electrically coupled to the second impurity regions 218b. The second conductive material may be formed of or include at least one of doped silicon, metals (e.g., tungsten or copper), or metal compounds (e.g., titanium nitride or tungsten nitride).

In some example embodiments, when the second contact holes 250 are filled with the second conductive material, the second opening 250a may also be filled with the second conductive material to form a second dummy pattern 255a. The second dummy pattern 255a may be in an electrically floating state. The second dummy pattern 255a may be, for example, a pillar-shaped structure penetrating the first and second interlayered insulating layers 225 and 245. Alternatively, the second dummy pattern 255a may include a pillar portion penetrating the first and second interlayered insulating layers 225 and 245 and a cover portion connected to the pillar portion. In this case, the second dummy pattern 255a may have a "T"-shaped section.

According to some example embodiments, the second dummy pattern 255a may be formed to completely fill the second opening 250a and have substantially the same structure as the second opening 250a. According to some example embodiments, the second dummy pattern 255a may be formed to partially cover or fill the second opening 250a to have a structure smaller than or different from the second opening 250a. According to some example embodiments, the second dummy pattern 255a may be formed to cover or fill the second opening 250a and to partially cover the first interlayered insulating layer 225, and thus, the second dummy pattern 255a may have a structure greater than or different from the second opening 250a.

Figure 12A:
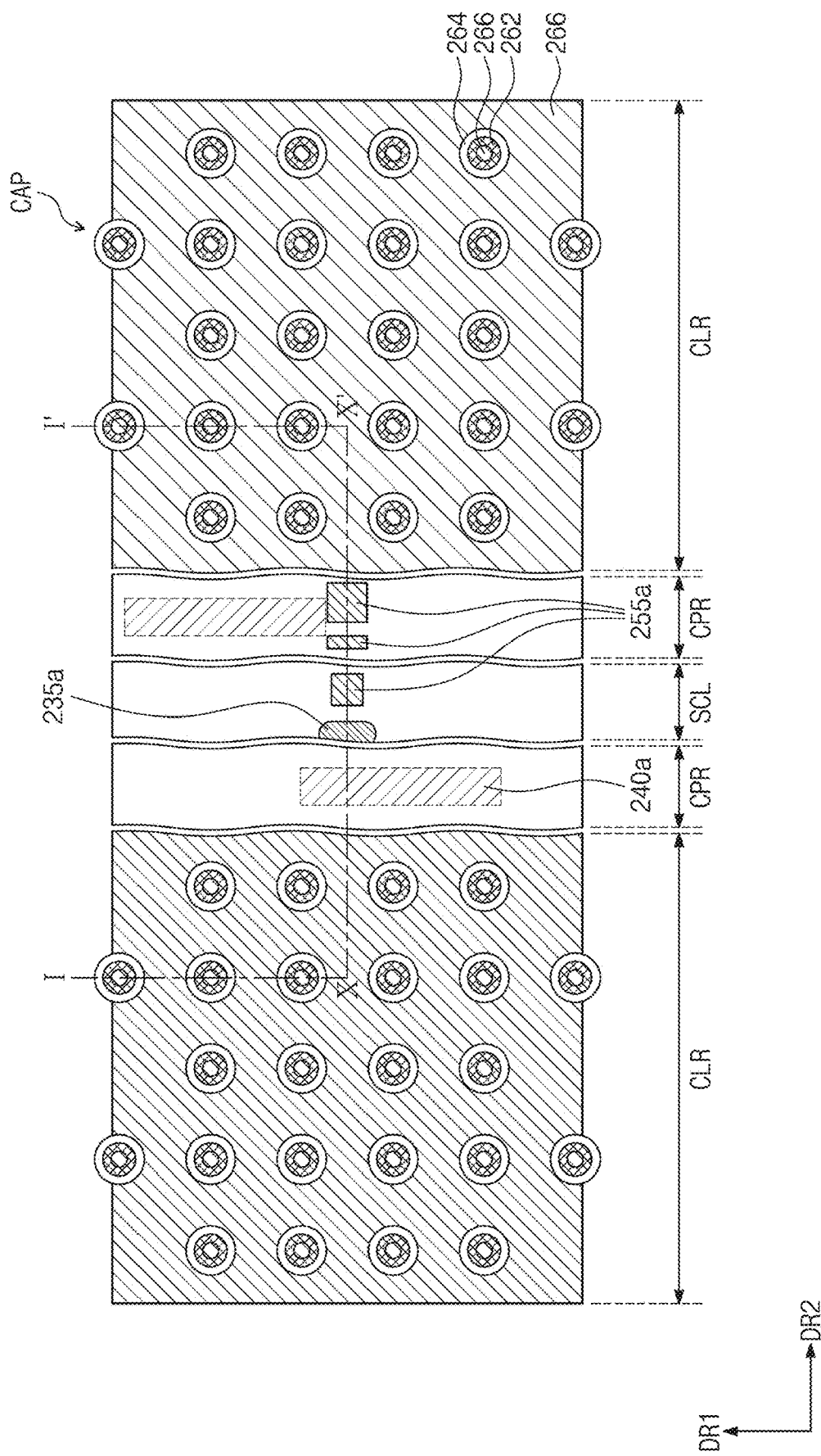
Figure 12B:
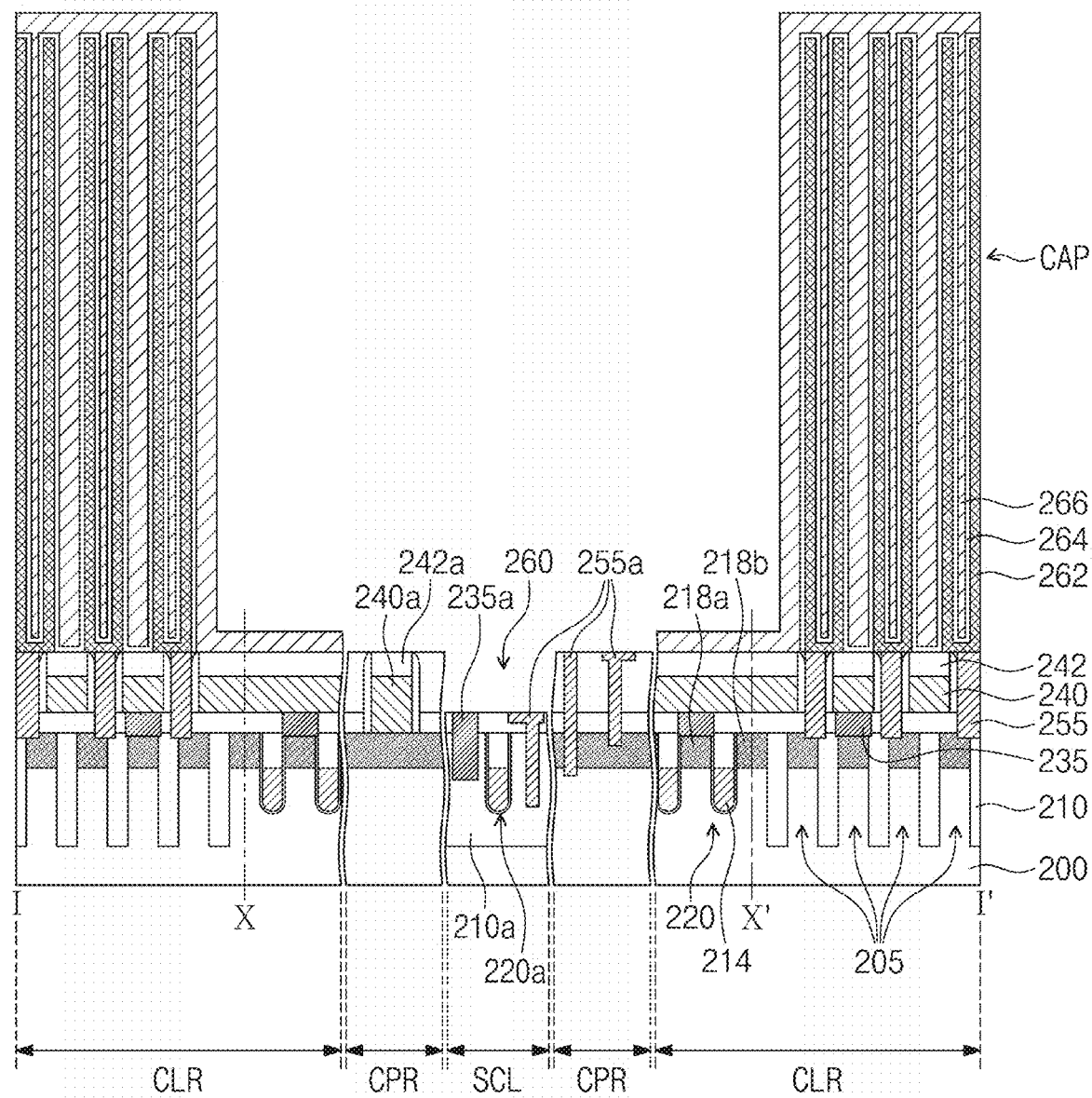

Referring to FIGS. 12A and 12B, capacitors CAP may be connected to the second contact plugs 255, respectively. The capacitors CAP may be formed on the cell region CLR.

In more detail, a third interlayered insulating layer (not shown) may be formed to cover the second contact plugs 255, and the third interlayered insulating layer may be etched to form holes (not shown) exposing the second contact plugs 255, respectively. A first electrode layer (not shown) may be conformally formed on the third interlayered insulating layer provided with the holes. The first electrode layer may be formed in such a way that the holes are not completely filled therewith. The holes provided with the first electrode layer may be filled with a sacrificial layer (not shown). The sacrificial layer and the first electrode layer may be etched to expose a top surface of the third interlayered insulating layer, and thus, first electrodes 262 having a cylinder shape may be formed in the holes. After the formation of the first electrodes 262, the sacrificial layer and the third interlayered insulating layer may be removed. In some example embodiments, supporter rings (not shown) may be additionally formed to prevent the first electrodes 262 having a high aspect ratio from being leaned or fallen.

A dielectric layer 264 may be formed to conformally cover inner and outer sidewalls of the first electrodes 262. Second electrodes 266 may be formed to fill spaces in or out of the first electrodes 262 provided with the dielectric layer 264. Here, each of the capacitors CAP may include the first electrode 262, the dielectric layer 264, and the second electrode 266.

Figure 13B:
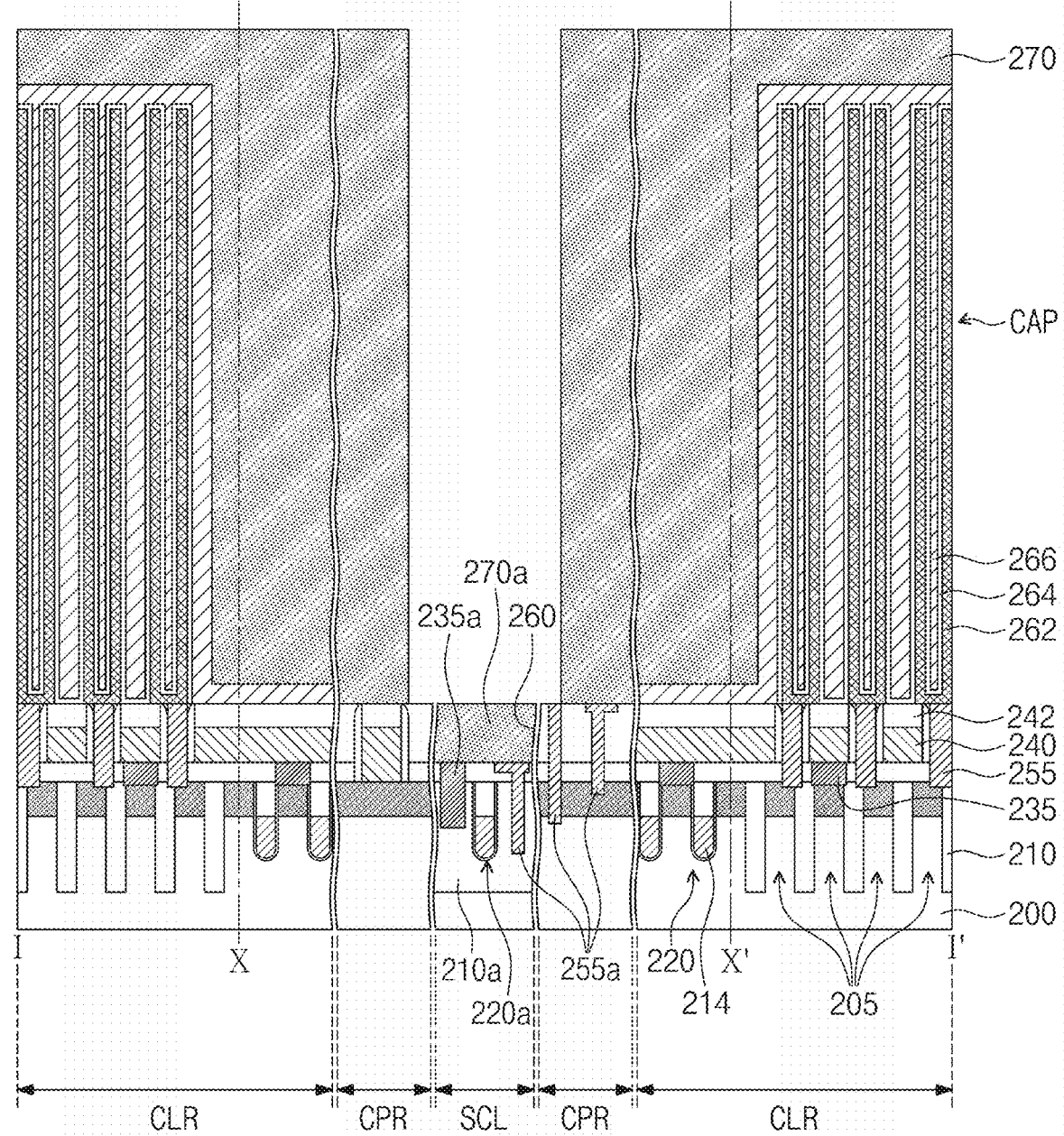

Referring to FIGS. 13A and 13B, a plate electrode layer 270 may be formed to connect the second electrodes 266 of the capacitors CAP to each other. The plate electrode layer 270 may be formed of or include silicon germanium.

Since a structure corresponding to the bit line structure or the core/peripheral gate electrode structure is not formed on the scribe line SCL (e.g., see FIGS. 9A and 9B), a stepwise region 260 at a level different from the cell region CLR and the core/peripheral region CPR may be formed on the scribe line SCL. The stepwise region 260 may have a line-shaped structure extending in the first direction DR1. The stepwise region 260 may be filled with the plate electrode layer 270 to form a third dummy pattern 270a. The third dummy pattern 270a may be in an electrically floating state.

According to some example embodiments, the third dummy pattern 270a may be formed to completely fill the stepwise region 260 and have substantially the same structure as the stepwise region 260. According to some example embodiments, the third dummy pattern 270a may be formed to partially cover or fill the stepwise region 260 to have a structure smaller than or different from the stepwise region 260. According to some example embodiments, the third dummy pattern 270a may be formed to cover the stepwise region 260 and have an upward-protruding structure.

Figure 14A:
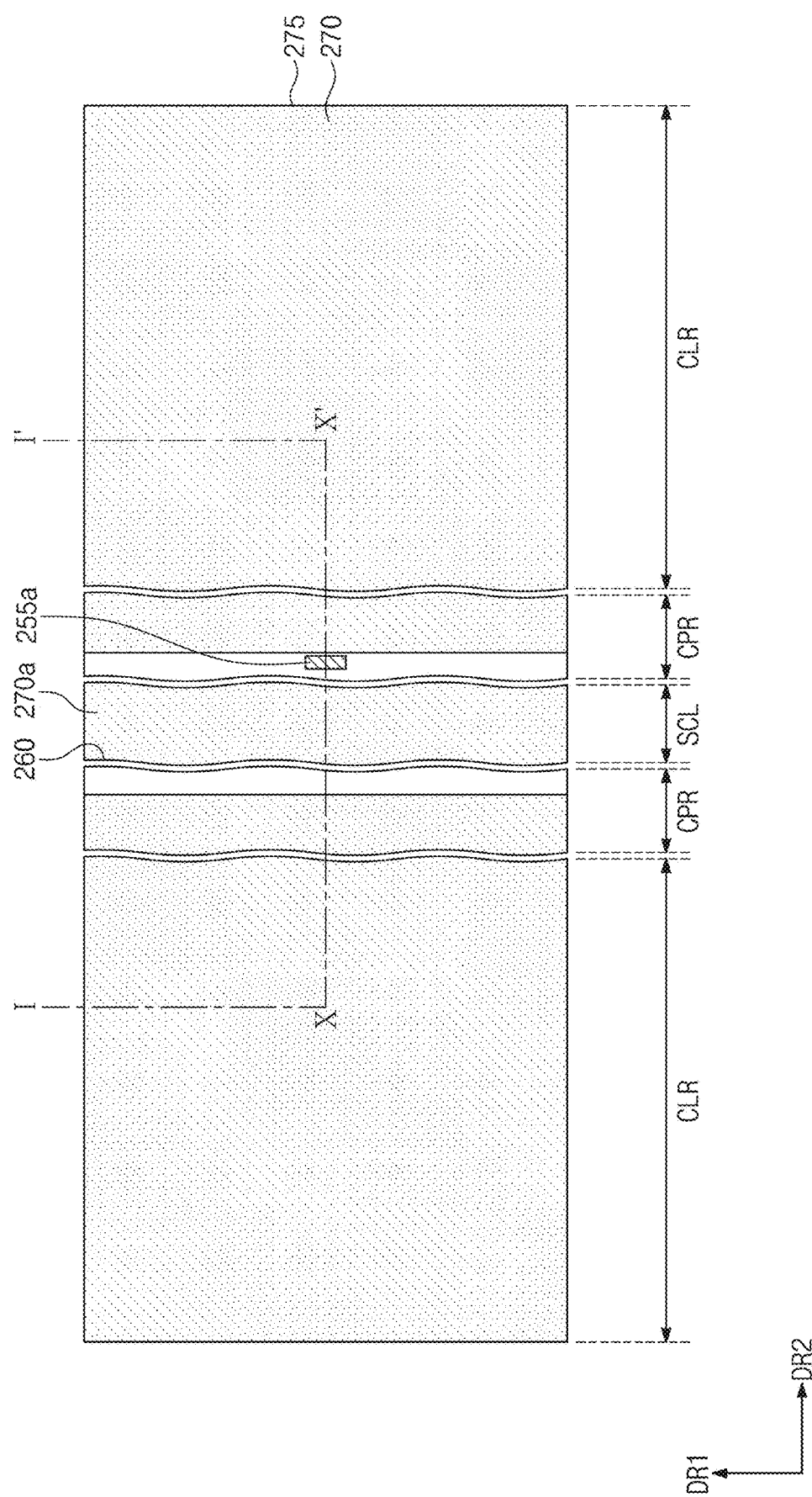
Figure 14B:
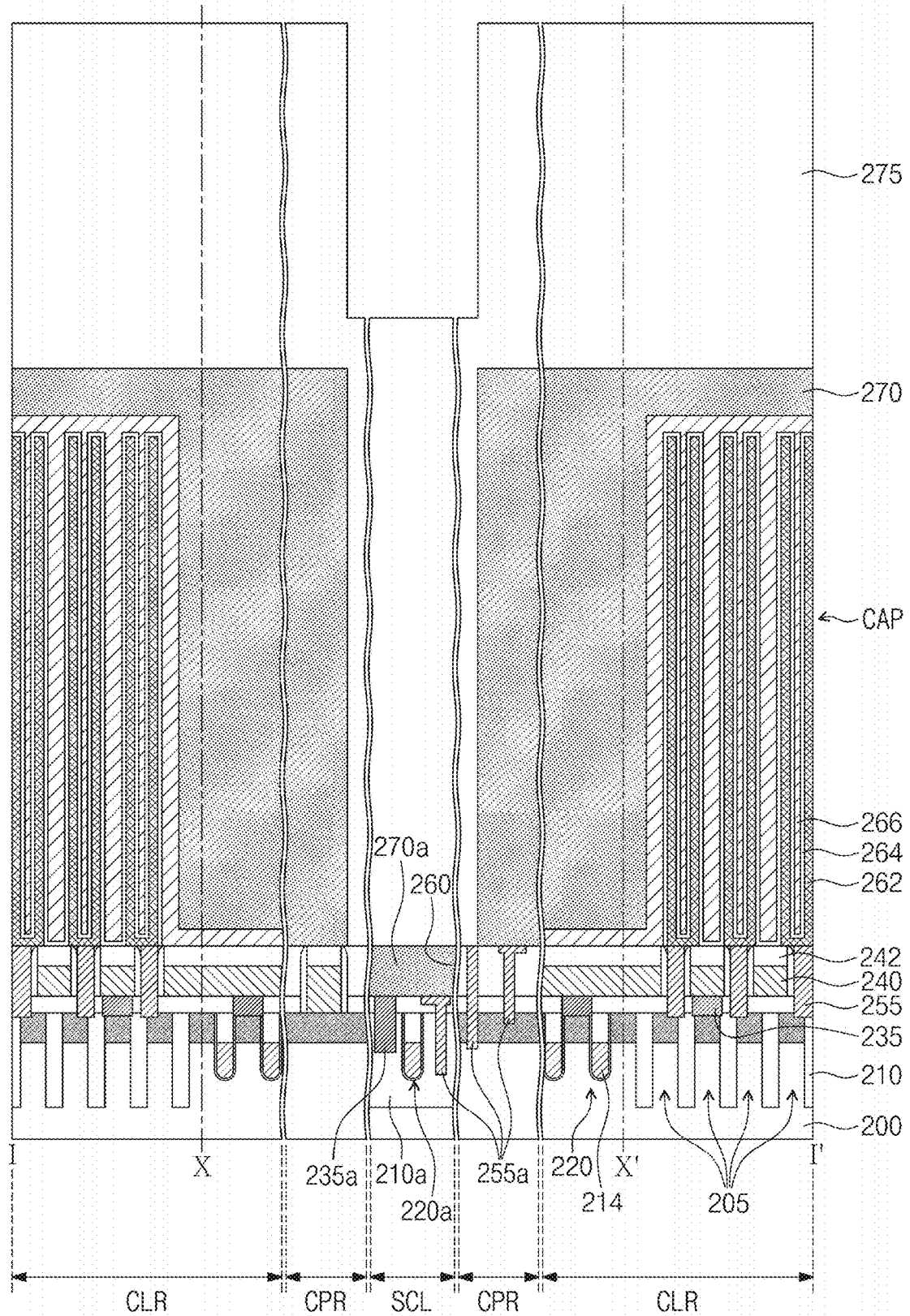

Referring to FIGS. 14A and 14B, a fourth interlayered insulating layer 275 may be formed on the substrate 200 provided with the plate electrode layer 270. Thereafter, a polishing process may be performed to polish a top surface of the fourth interlayered insulating layer 275.

As described above, the capacitors CAP and the bit lines 240 may be formed on the cell region CLR but not on the scribe line SCL, and thus, the stepwise region 260 with a very large depth may be formed between the cell region CLR and the scribe line SCL. In the present embodiment, the third dummy pattern 270a may be formed between the bit lines 240 (i.e., on the scribe line SCL), and this may reduce a height difference of the stepwise region 260 between the cell region CLR and the scribe line SCL and between the core/peripheral region and the scribe line SCL.

Accordingly, a thickness of the fourth interlayered insulating layer 275 may be reduced by a height of the third dummy pattern 270a, and this makes it possible for the fabrication process to be performed with lower cost and higher productivity. Furthermore, it is possible to improve uniformity in thickness of the fourth interlayered insulating layer 275, on which the polishing process is performed.

Figure 15:
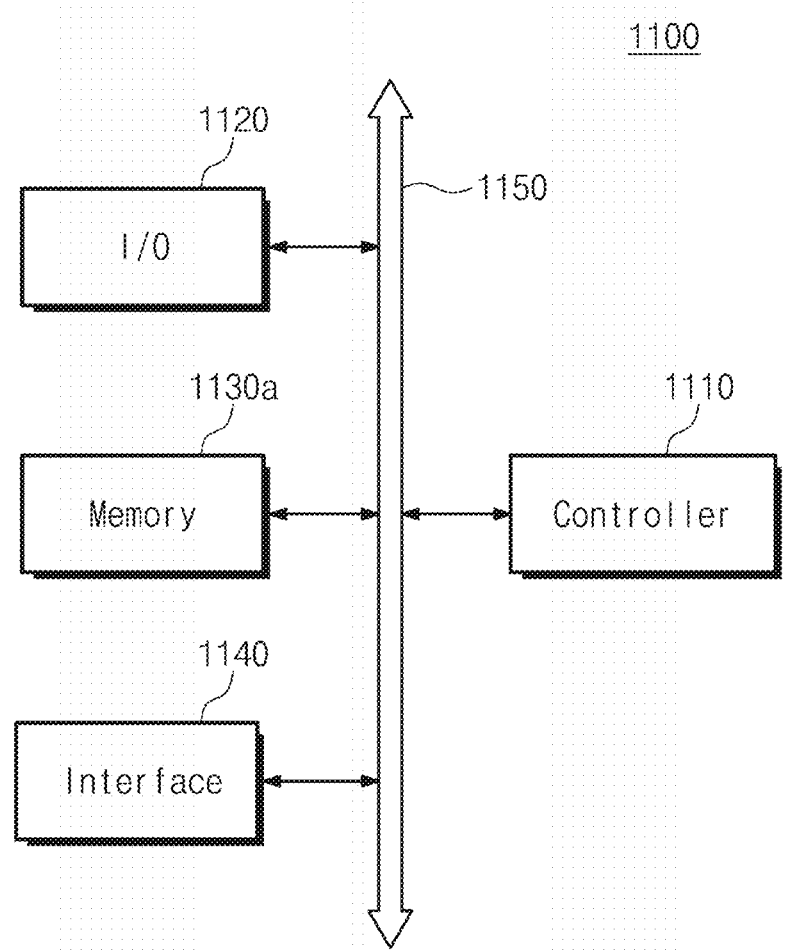
FIG. 15 is a schematic block diagram illustrating an example of electronic systems including a semiconductor device, according to some example embodiments of the inventive concepts.

FIG. 15 is a schematic block diagram illustrating an example of electronic systems including a semiconductor device according to some example embodiments of the inventive concepts.

Referring to FIG. 15, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. At least one of the controller 1110, the input-output unit 1120, the memory device 1130, and/or the interface 1140 may include a semiconductor device according to some example embodiments of the inventive concepts.

The controller 1110 may include, e.g., at least one of a microprocessor, a digital signal processor, a microcontroller, or another logic device, which is configured to have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate in a wireless or wireless manner. For example, the interface unit 1140 may include an antenna for wireless communication or a wireless transceiver for wireless communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or an electronic product, which is configured to receive or transmit information data wirelessly.

Figure 16:
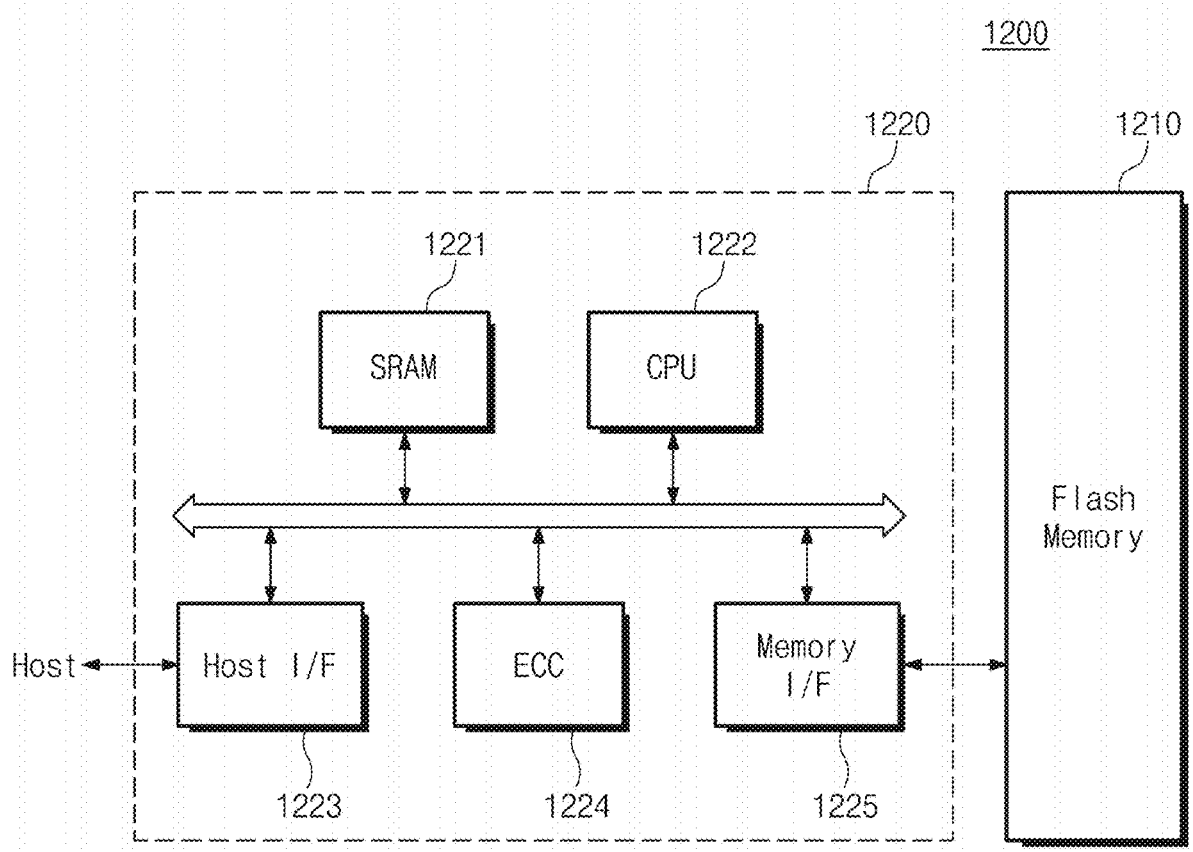
FIG. 16 is a schematic block diagram illustrating an example of memory cards including a semiconductor device, according to some example embodiments of the inventive concepts.

FIG. 16 is a schematic block diagram illustrating an example of memory cards including a semiconductor device according to some example embodiments of the inventive concepts.

Referring to FIG. 16, at least one semiconductor memory device 1210 according to some example embodiments of the inventive concepts may be used in a memory card 1200 with a large memory capacity. The memory card 1200 may include a memory controller 1220 configured to control a data exchange operation between a host and the semiconductor memory device 1210.

A static random access memory (SRAM) 1221 may be used as an operation memory of a processing unit 1222. A host interface 1223 may include data exchange protocols of a host to be connected to the memory card 1200. An error correction block 1224 may be configured to detect and correct errors included in data readout from a multi bit semiconductor memory device 1210. A memory interface 1225 may be configured to interface with the semiconductor memory device 1210. The processing unit 1222 may perform every control operation for exchanging data of the memory controller 1220. Even though not depicted in drawings, it is apparent to one of ordinary skill in the art that the memory card 1200 according to some example embodiments of the inventive concepts may further include a ROM (not shown) storing code data for interfacing with the host.

FIGS. 17A, 17B, 17C, 17D, 17E, 17F, 17G, 17H, 17I, 17J, 17K, 17L, 17M, 17N, 17O, and 17P are sectional views illustrating a process of fabricating a semiconductor device, according to some example embodiments of the inventive concept.

Referring to FIG. 17A, a semiconductor substrate 301 including a first region A1, a second region B1, and a third region C1 may be prepared. The first region A1 may be, for example, a cell array region. The second region B1 may be, for example, a peripheral circuit region. The third region C1 may be, for example, a region, on which a through electrode will be formed. The third region C1 may be provided at or near a center or edge region or a center line of a semiconductor chip. The second region B1 may be provided between the first region A1 and the third region C1. The semiconductor substrate 301 may be provided in the form of, for example, a single crystalline silicon wafer. A device isolation layer 303 may be formed in the semiconductor substrate 301 to define active regions. The active regions, which are defined by the device isolation layer 303 in the first region A1, may have the same planar shapes as those shown in the cell regions CLR of FIG. 6A.

Although not shown, word lines may be provided on the first region A1 to cross the active regions. The word lines may be buried in the semiconductor substrate 301, as shown in FIGS. 6A and 6B. A word line gate insulating layer may be interposed between the word lines and the semiconductor substrate 301. Word line capping patterns may be provided on the word lines. In the first region A1, a first impurity injection region 305a and a second impurity injection region 305b may be formed in the semiconductor substrate 301 between the word lines.

A first interlayered insulating layer 307 may be formed on the semiconductor substrate 301 to cover the first region A1. The first interlayered insulating layer 307 may be formed of or include, for example, silicon nitride. The first interlayered insulating layer 307 may be formed to expose top surfaces of the second and third regions B1 and C1 of the semiconductor substrate 301. A peripheral gate insulating layer 309 may be formed on the semiconductor substrate 301 to cover the second and third regions B1 and C1. The peripheral gate insulating layer 309 may be formed of or include, for example, at least one of silicon nitride or metal oxide materials. When the peripheral gate insulating layer 309 is formed, the first interlayered insulating layer 307 may be used as a mask covering the first region A1.

Referring to FIG. 17B, a first poly-silicon layer may be formed on the semiconductor substrate 301. The first poly-silicon layer may be doped with impurities or may be formed of a doped silicon layer. The first poly-silicon layer may be patterned to form a first polysilicon mask pattern 311 on the first region A1, and here, the first polysilicon mask pattern 311 may be formed to have an opening defining a position of a bit line contact DC to be formed in a subsequent step. The first polysilicon mask pattern 311 may be formed to cover the second region B1 and the third region C1. The first interlayered insulating layer 307 and the semiconductor substrate 301 may be patterned using the first polysilicon mask pattern 311 as an etch mask, and as a result, a bit line contact hole 313 may be formed to expose the first impurity injection region 305a. The device isolation layer 303 may also be etched, when the bit line contact hole 313 is formed.

Figure 17C:
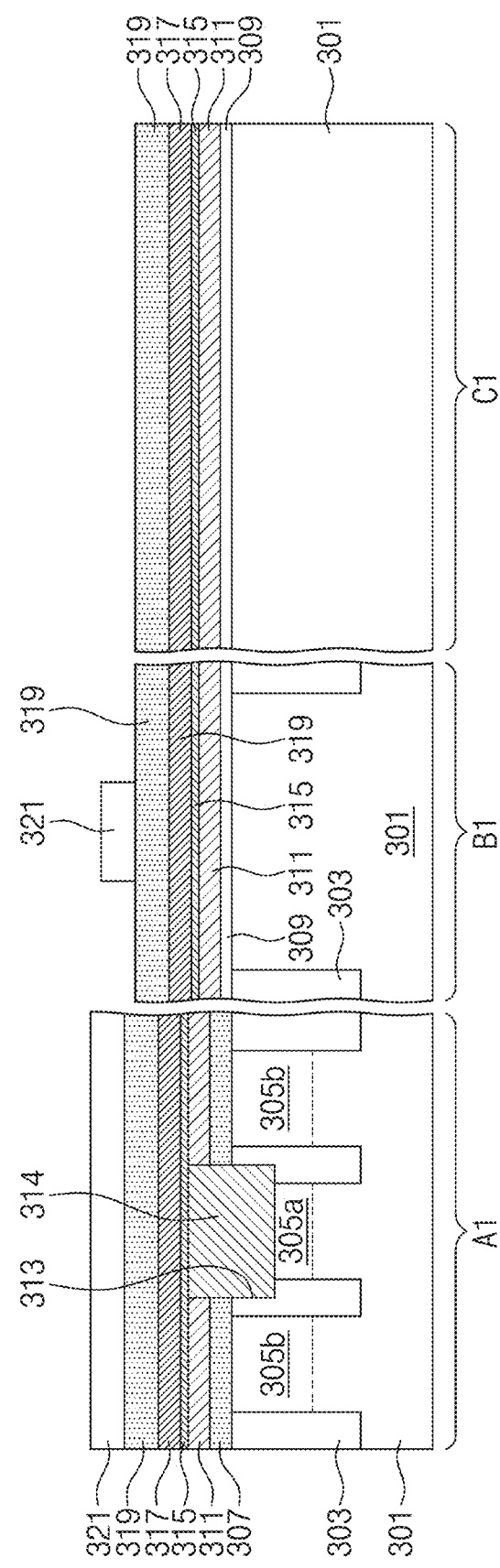

Referring to FIG. 17C, a second poly-silicon layer may be formed on the semiconductor substrate 301 to fill the bit line contact hole 313, and then, a polishing process may be performed on the second poly-silicon layer to expose the first polysilicon mask pattern 311 and to form a second polysilicon pattern 314 in the bit line contact hole 313. A top surface of the second polysilicon pattern 314 may be substantially coplanar with a top surface of the first polysilicon mask pattern 311. A first ohmic layer 315, a first metal containing layer 317, and a first capping layer 319 may be sequentially stacked on the second polysilicon pattern 314 and the first polysilicon mask pattern 311. The first ohmic layer 315 may be formed of or include, for example, cobalt silicide. The first metal containing layer 317 may be formed of or include, for example, at least one of titanium nitride or tungsten. The first capping layer 319 may be formed of or include, for example, silicon nitride. A first mask pattern 321 may be formed on the first capping layer 319. The first mask pattern 321 may be used to define a peripheral gate on the second region B1. The first mask pattern 321 may be formed to fully cover the first region A1 and to fully expose the third region C1. The first mask pattern 321 may include, for example, at least one of a photoresist pattern or a carbon containing layer.

Figure 17D:
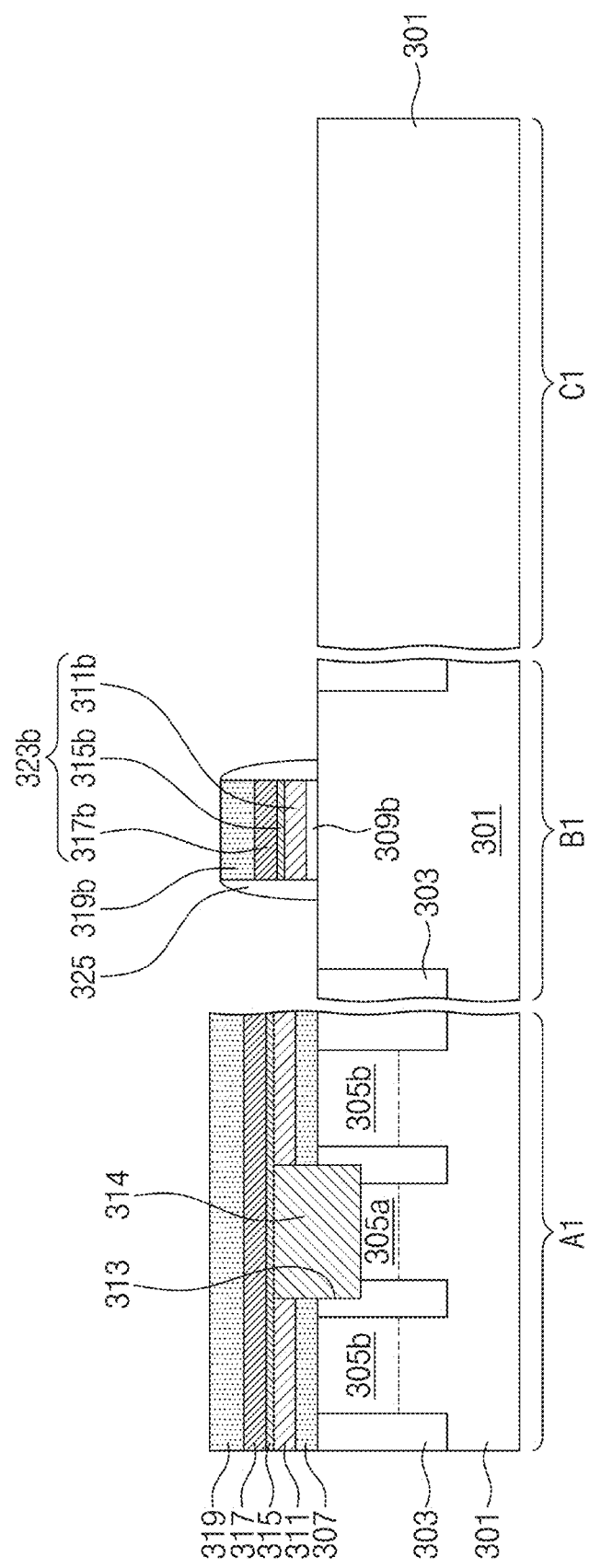

Referring to FIG. 17D, the first capping layer 319, the first metal containing layer 317, the first ohmic layer 315, the first polysilicon mask pattern 311, and the peripheral gate insulating layer 309 may be sequentially etched using the first mask pattern 321 as an etch mask so as to expose a top surface of the semiconductor substrate 301, and thus, a peripheral gate insulating pattern 309b, a peripheral gate electrode 323b, and a peripheral capping pattern 319b, which are sequentially stacked, may be formed on the second region B1. The peripheral gate electrode 323b may include a first peripheral polysilicon pattern 311b, a first peripheral ohmic pattern 315b, and a first peripheral metal containing pattern 317b, which are sequentially stacked on the semiconductor substrate 301. Here, the peripheral gate insulating layer 309, the first polysilicon mask pattern 311, the first ohmic layer 315, the first metal containing layer 317, and the first capping layer 319 may be removed from the third region C1 to expose the entire top surface of the third region C1 of the semiconductor substrate 301. By contrast, since the first region A1 is covered with the first mask pattern 321, the first region A1 may not be etched by the etching process for forming the peripheral gate electrode 323b. The first mask pattern 321 may be removed, after the etching process for forming the peripheral gate electrode 323b. A peripheral spacer 325 may be formed to cover side surfaces of the peripheral capping pattern 319b, the peripheral gate electrode 323b, and the peripheral gate insulating pattern 309b.

The first mask pattern 321 may be removed, after the formation of the peripheral spacer 325. Here, the first mask pattern 321 may protect the first region A1, when the peripheral spacer 325 is formed.

Figure 17E:
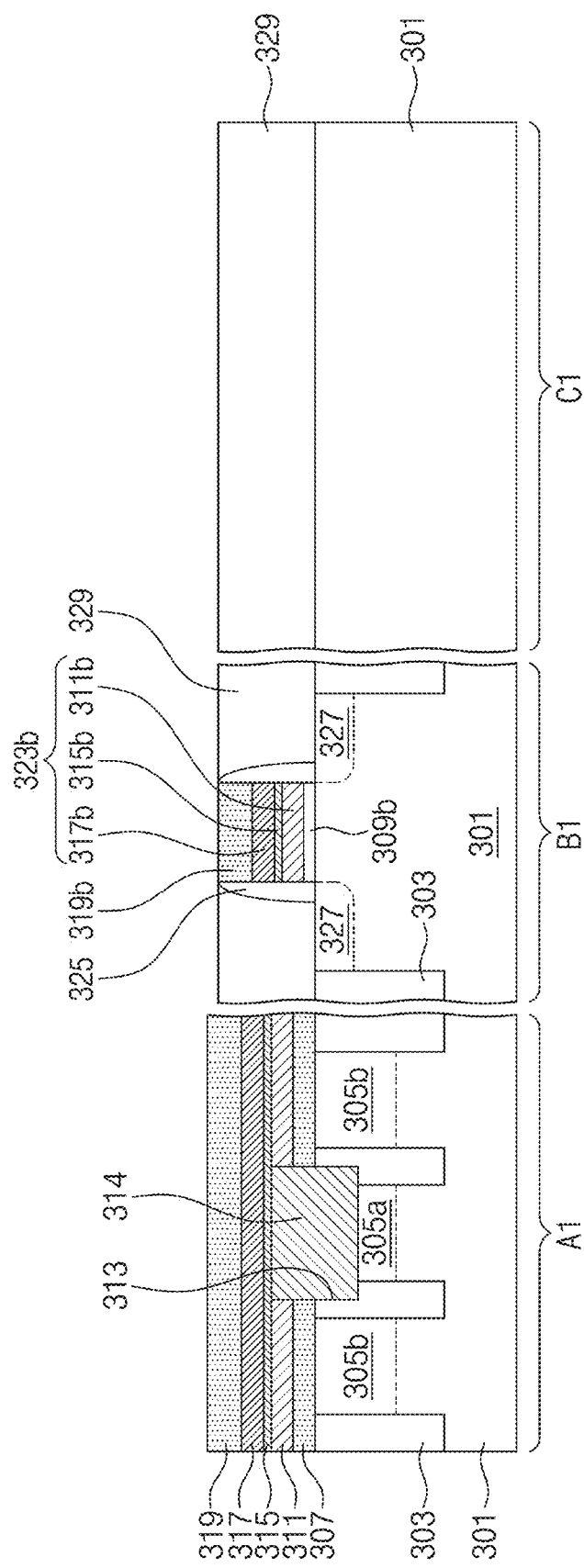

Referring to FIG. 17E, an ion implantation process may be performed to form peripheral source/drain regions 327 in portions of the semiconductor substrate 301 which are located at both sides of the peripheral gate electrode 323b. The first region A1 and the third region C1 may be veiled by a mask, during the ion implantation process. After the formation of the peripheral source/drain regions 327, a second interlayered insulating layer 329 may be formed to fully cover the semiconductor substrate 301. The second interlayered insulating layer 329 may be formed of or include, for example, at least one of silicon oxide, silicon oxynitride, silicon nitride, or porous oxide. A polishing process on the second interlayered insulating layer 329 may be performed to expose a top surface of the first capping layer 319 on the first region A1 and to expose a top surface of the peripheral capping pattern 319b on the second region B1. The second interlayered insulating layer 329 may be formed to cover portions of the second region B1 of the semiconductor substrate 301, which are not covered by the peripheral gate electrode 323b, and to fully cover the third region C1 of the semiconductor substrate 301.

Figure 17F:
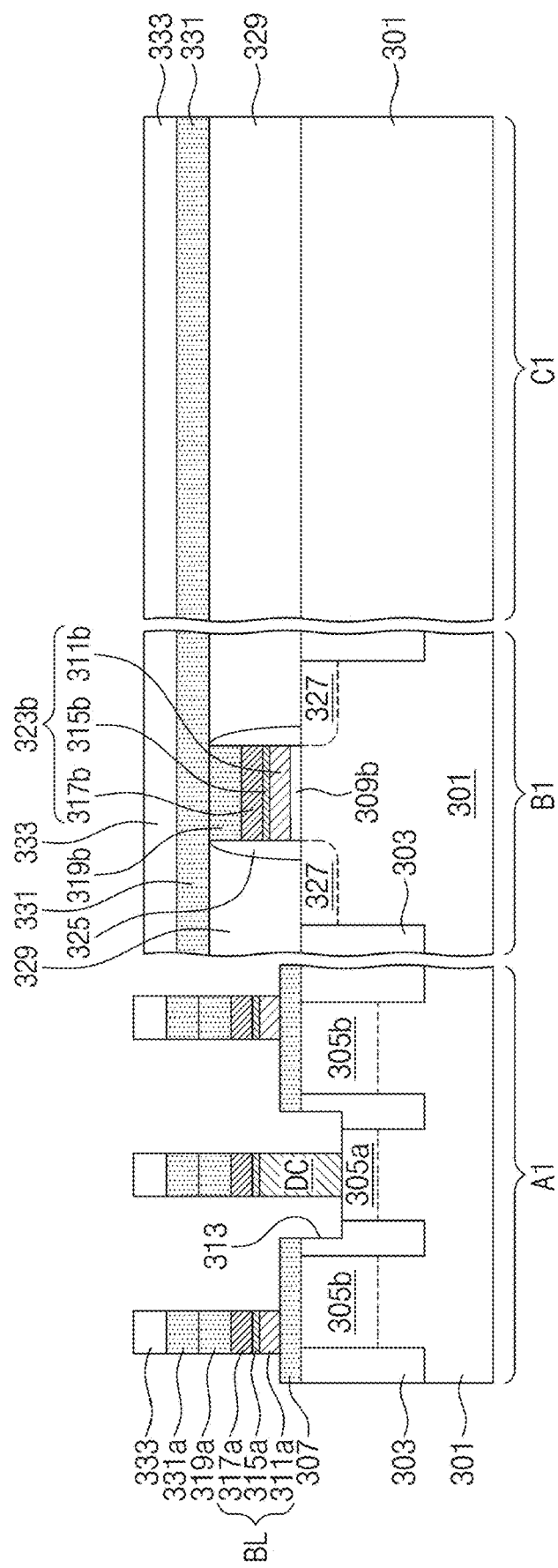

Referring to FIG. 17F, a second capping layer 331 may be formed on the semiconductor substrate 301. The second capping layer 331 may be formed of or include, for example, silicon nitride. A second mask pattern 333 may be formed on the second capping layer 331 to define a position and shape of a bit line BL to be formed on the first region A1. The second mask pattern 333 may include, for example, at least one of a photoresist pattern or a carbon containing layer. The second mask pattern 333 may be formed to fully cover the second and third regions B1 and C1. Thereafter, the second capping layer 331, the first capping layer 319, the first metal containing layer 317, the first polysilicon mask pattern 311, and the second polysilicon pattern 314 may be etched using the second mask pattern 333 as an etch mask, and thus, a bit line contact DC and a bit line BL, a first capping pattern 319a, and a second capping pattern 331a, which are stacked on the bit line contact DC, may be formed on the first region A1. When viewed in a plan view, the bit line contact DC may be formed at a position corresponding to each of the first contact plugs 235 of FIG. 8A. When viewed in a plan view, the bit line BL may be formed at a position corresponding to the bit line 240 of FIG. 9A. The bit line BL may be in contact with the bit line contact DC. The bit line BL may include a first cell ohmic pattern 315a and a first cell metal containing pattern 317a, which are sequentially stacked. The bit line BL may further include a first cell polysilicon pattern 311a. The etching process for forming the bit line BL may be performed to partially expose an inner side surface and a bottom surface of the bit line contact hole 313. Furthermore, a top surface of the first interlayered insulating layer 307 may be partially exposed. In the bit line contact hole 313, a side surface of the bit line contact DC may be exposed.

Figure 17G:
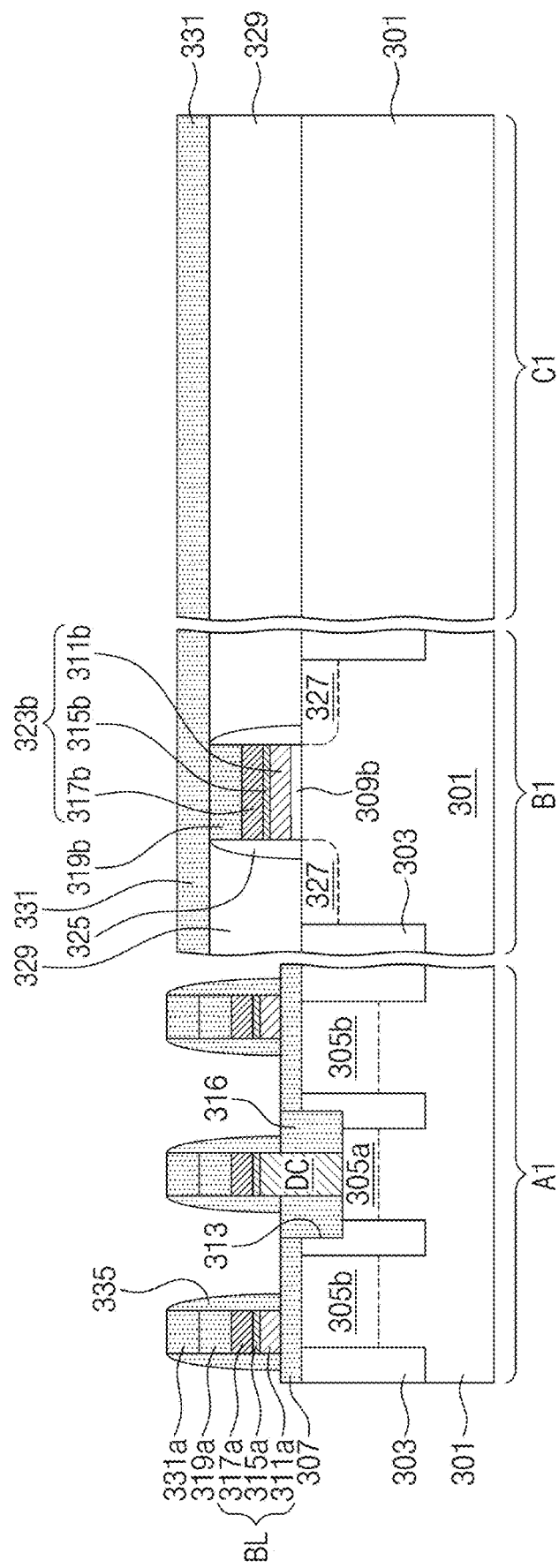

Referring to FIG. 17G, an insulating layer may be formed and etched to form a first insulating pattern 316 filling the bit line contact hole 313. The first insulating pattern 316 may be formed of or include at least one of silicon nitride, silicon oxide, or silicon oxynitride and may be formed to have a single- or multi-layered structure. The top surface of the first interlayered insulating layer 307 may be exposed, after the formation of the first insulating pattern 316. A bit line spacer 335 may be formed to cover side surfaces of the bit line BL, the first capping pattern 319a, and the second capping pattern 331a, and the formation of the bit line spacer 335 may include conformally forming a spacer layer on the semiconductor substrate 301 and anisotropically etching the spacer layer. The bit line spacer 335 may be formed of or include at least one of silicon nitride, silicon oxide, or silicon oxynitride and may be formed to have a single- or multi-layered structure.

Figure 17H:
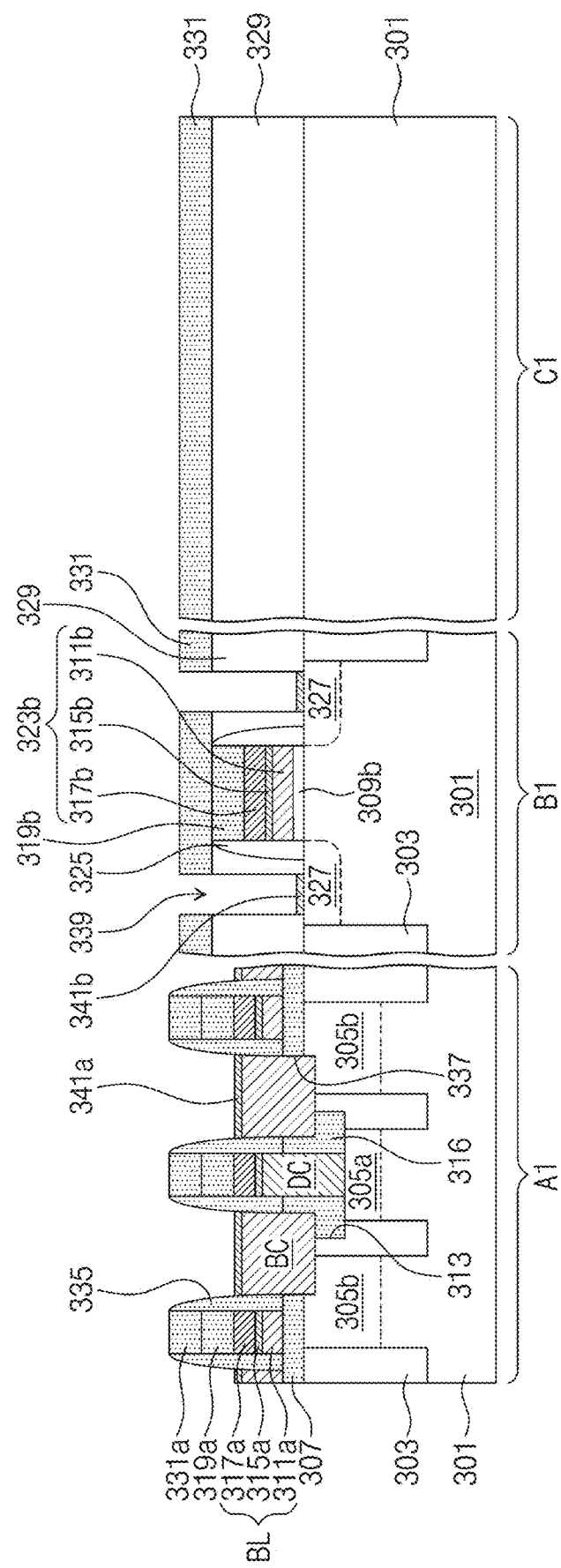

Referring to FIG. 17H, the first interlayered insulating layer 307 between the bit lines BL may be etched to form a storage node contact hole exposing the second impurity injection region 305b. Here, the first insulating pattern 316, the device isolation layer 303, and the semiconductor substrate 301 may be partially etched. A doped poly-silicon layer may be deposited on the semiconductor substrate 301 to fill the storage node contact hole, and then, an anisotropic etching process may be performed to form a storage node contact BC partially filling the storage node contact hole. When viewed in a plan view, a position of the storage node contact BC may correspond to that of the second contact plug 255 of FIG. 11A. On the second region B1, the second capping layer 331 and the second interlayered insulating layer 329 may be sequentially patterned to form a peripheral contact hole 339 exposing the peripheral source/drain region 327. A silicidation process may be performed to form a second ohmic layer 341a on the storage node contact BC and to form a third ohmic layer 341b on a top surface of the semiconductor substrate 301 exposed by the peripheral contact hole 339. The second ohmic layer 341a and the third ohmic layer 341b may be formed of or include, for example, cobalt silicide.

Figure 17I:
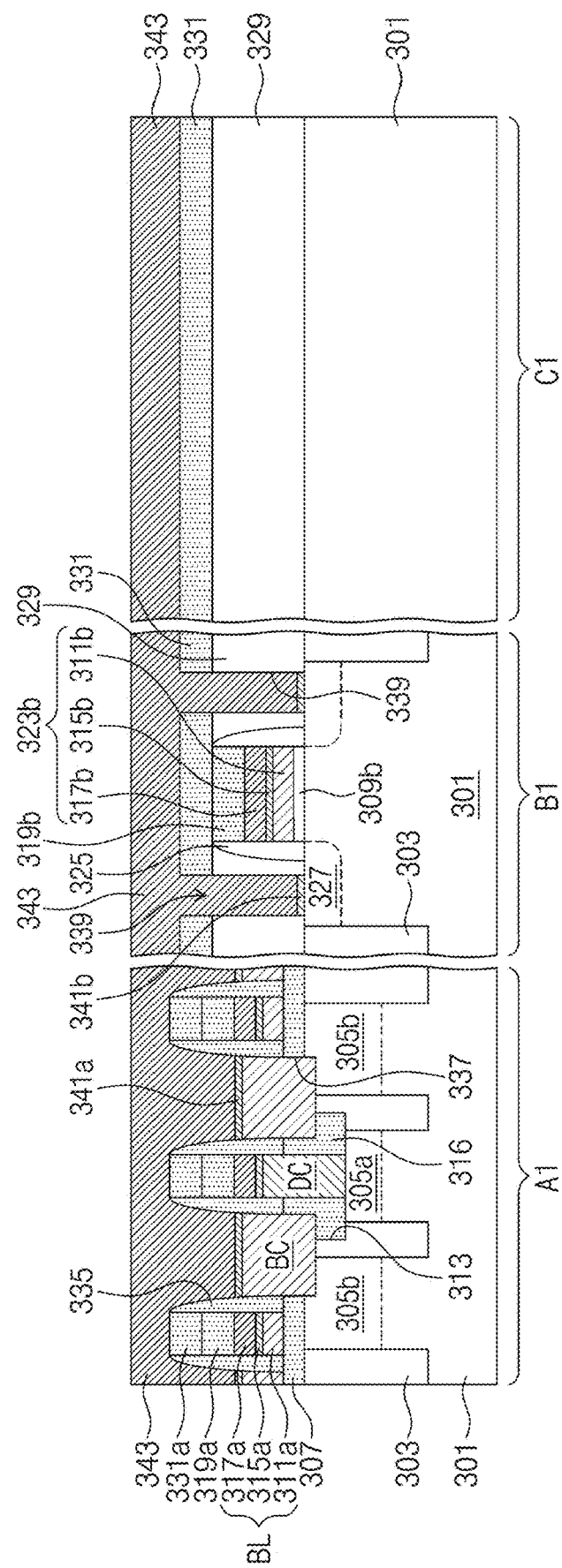

Referring to FIG. 17I, a second metal containing layer 343 may be formed on the semiconductor substrate 301 to fill the storage node contact hole and the peripheral contact hole 339. The second metal containing layer 343 may be formed of or include, for example, titanium nitride or tungsten.

Figure 17J:
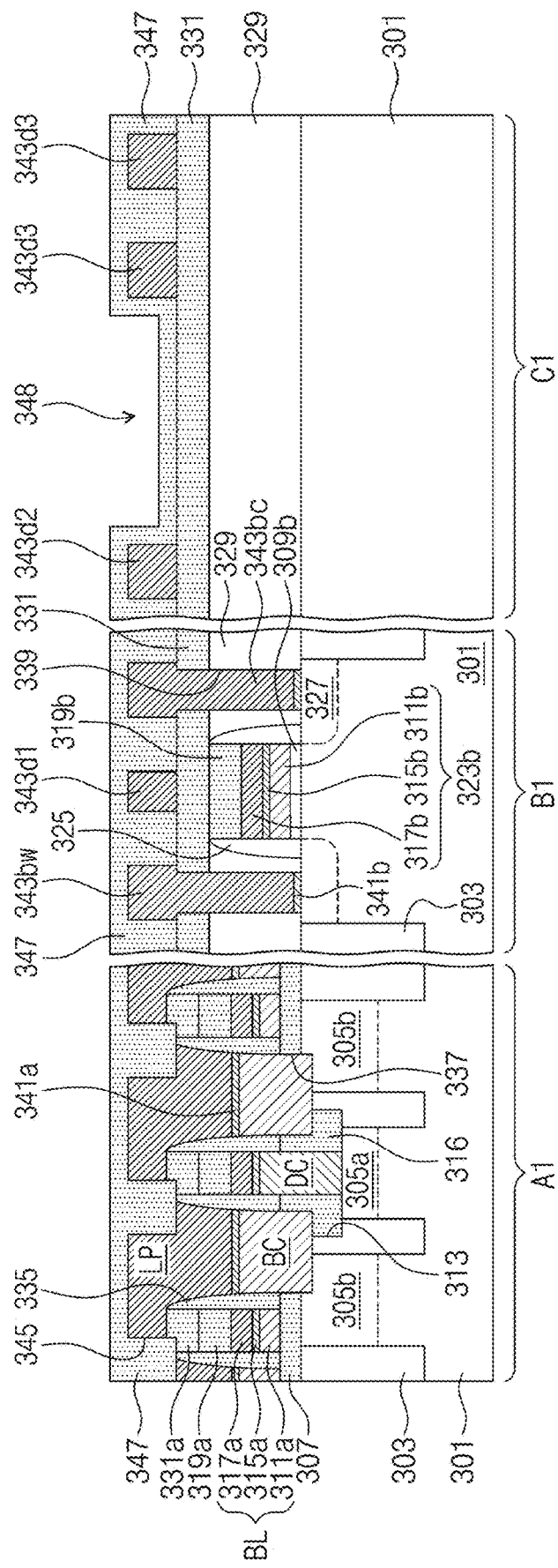

Referring to FIG. 17J, the second metal containing layer 343 may be etched to form a landing pad LP, which is electrically connected to the storage node contact BC, on the first region A1. The etching of the second metal containing layer 343 may be performed to form a peripheral conductive pattern 343bw on the second region B1 and to form a peripheral contact 343bc in the peripheral contact hole 339. The peripheral conductive pattern 343bw may be an interconnection line or a contact pad, which is provided on the peripheral circuit region. The etching of the second metal containing layer 343 may be performed to form first to third dummy conductive patterns 343d1, 343d2, and 343d3 on the second and third regions B1 and C1. The first to third dummy conductive patterns 343d1, 343d2, and 343d3 may be formed to prevent a dishing phenomenon from occurring in a subsequent process of polishing an insulating separation layer 347. On the second region B1, a distance between the peripheral conductive pattern 343bw and the first dummy conductive pattern 343d1 adjacent thereto may be equal or similar to a distance between the landing pads LP. On the third region C1, a distance between the third dummy conductive patterns 343d3 adjacent to each other may be equal or similar to the distance between the landing pads LP. However, the first to third dummy conductive patterns 343d1, 343d2, and 343d3 may not be formed at a portion of the third region C1 for a through electrode 367 to be formed in a subsequent process. That is, a distance between the second and third dummy conductive patterns 343d2 and 343d3 adjacent thereto may be greater than the distance between the landing pads LP. The second capping layer 331 may be used as an etch stop layer, when the second metal containing layer 343 is etched. After the formation of the landing pads LP, the peripheral conductive pattern 343bw, and the first to third dummy conductive patterns 343d1, 343d2, and 343d3, the insulating separation layer 347 may be formed on the semiconductor substrate 301. The insulating separation layer 347 may be thick enough to fill a space between the landing pads LP. The insulating separation layer 347 may be formed of or include, for example, silicon nitride. The insulating separation layer 347 may be formed to have a recessed region 348 at the portion of the third region C1 for the through electrode 367.

Figure 17K:
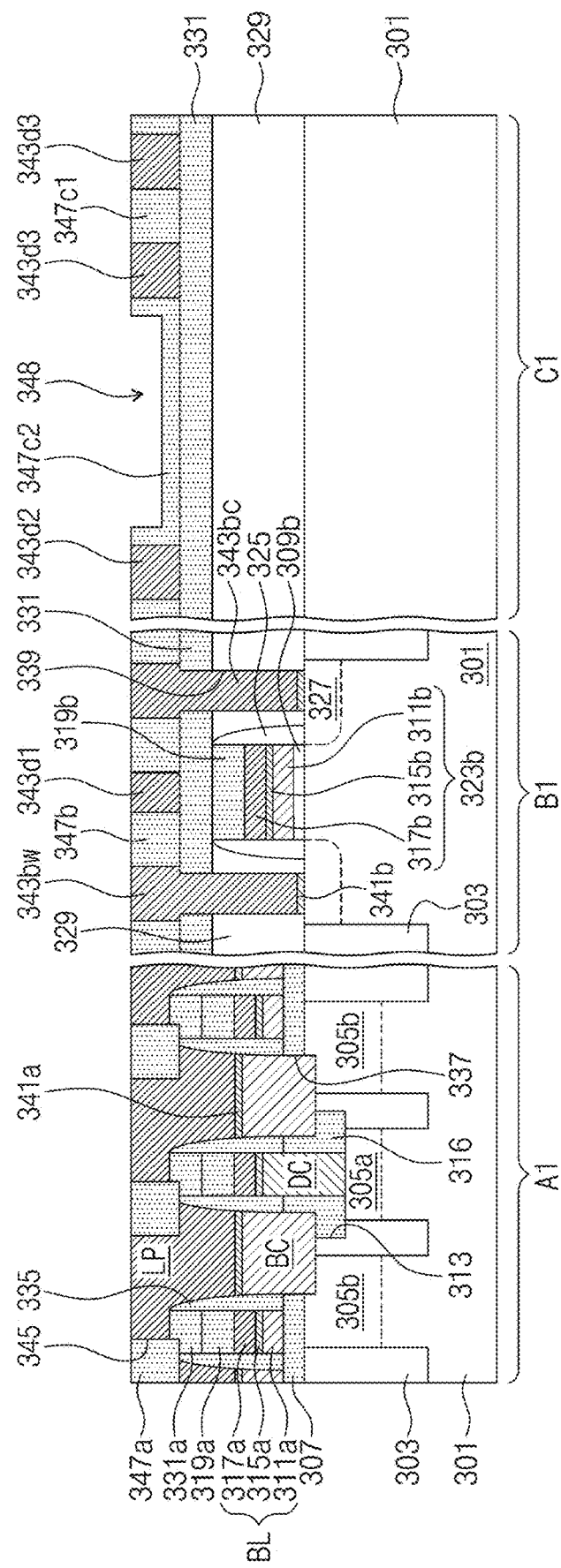

Referring to FIG. 17K, a polishing process on the insulating separation layer 347 may be performed to form a first separation pattern 347a between the landing pads LP, a second separation pattern 347b between the peripheral conductive pattern 343bw and the first dummy conductive pattern 343d1, a third separation pattern 347c1 between the third dummy conductive patterns 343d3, and a fourth separation pattern 347c2 between the second and third dummy conductive patterns 343d2 and 343d3, and to expose top surfaces of the landing pads LP, the peripheral conductive pattern 343bw, and the first to third dummy conductive patterns 343d1, 343d2, and 343d3. The fourth separation pattern 347c2 may be formed to have the recessed region 348 at its upper portion. The fourth separation pattern 347c2 may have a uniform thickness, between the second and third dummy conductive patterns 343d2 and 343d3.

Figure 17L:
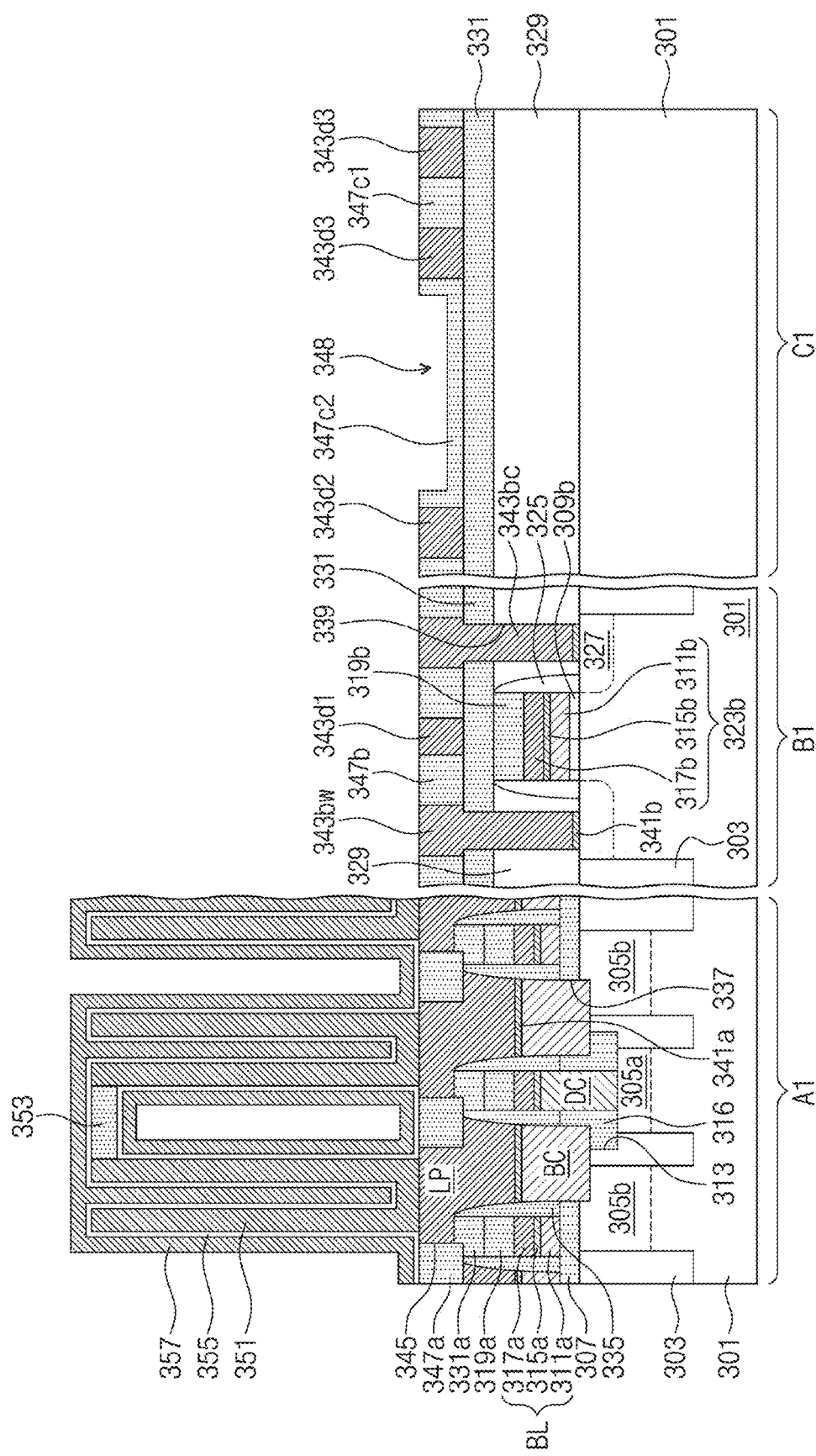

Referring to FIG. 17L, lower electrodes 351 may be formed on the first region A1 and on the landing pads LP, respectively. The lower electrodes 351 may be formed to have a hollow cup shape or a circular pillar shape. The lower electrodes 351 may be formed of or include a metal containing layer (e.g., a titanium nitride layer). A support pattern 353 may be formed between the lower electrodes 351 to prevent the lower electrodes 351 from collapsing. The support pattern 353 may be formed of or include, for example, silicon nitride. A dielectric layer 355 may be formed to conformally cover exposed surfaces of the lower electrodes 351 and the support pattern 353. The dielectric layer 355 may be formed of or include at least one of high-k dielectric materials (e.g., aluminum oxide). An upper electrode 357 may be formed to cover the dielectric layer 355. The upper electrode 357 may be formed of or include a metal containing layer (e.g., a titanium nitride layer). The upper electrode 357, the dielectric layer 355, and the lower electrode 351 may constitute a capacitor.

Figure 17M:
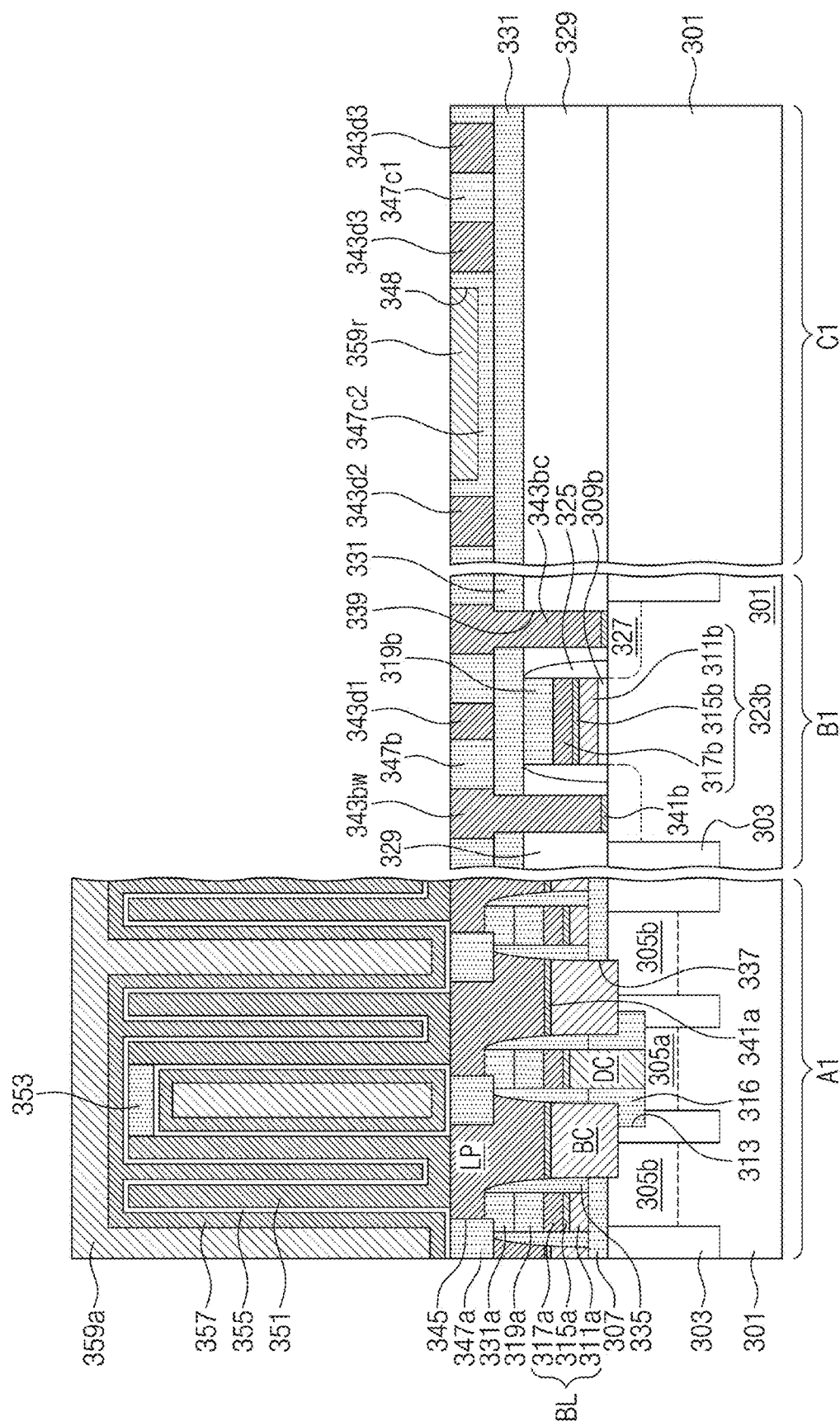

Referring to FIG. 17M, a plate electrode layer may be formed on the semiconductor substrate 301, and then, the plate electrode layer may be etched using a mask (not shown) veiling only the first region A1. Thus, on the first region A1, a plate electrode 359a may be formed to cover the upper electrode 357, and, on the third region C1, a remaining electrode pattern 359r may be formed in the recessed region 348. The plate electrode layer may be formed of or include, for example, doped silicon germanium or tungsten. The remaining electrode pattern 359r may be formed to fill the recessed region 348 of the fourth separation pattern 347c2. Here, the remaining electrode pattern 359r may be formed to have a top surface that is coplanar with a top surface of the fourth separation pattern 347c2.

Figure 17N:
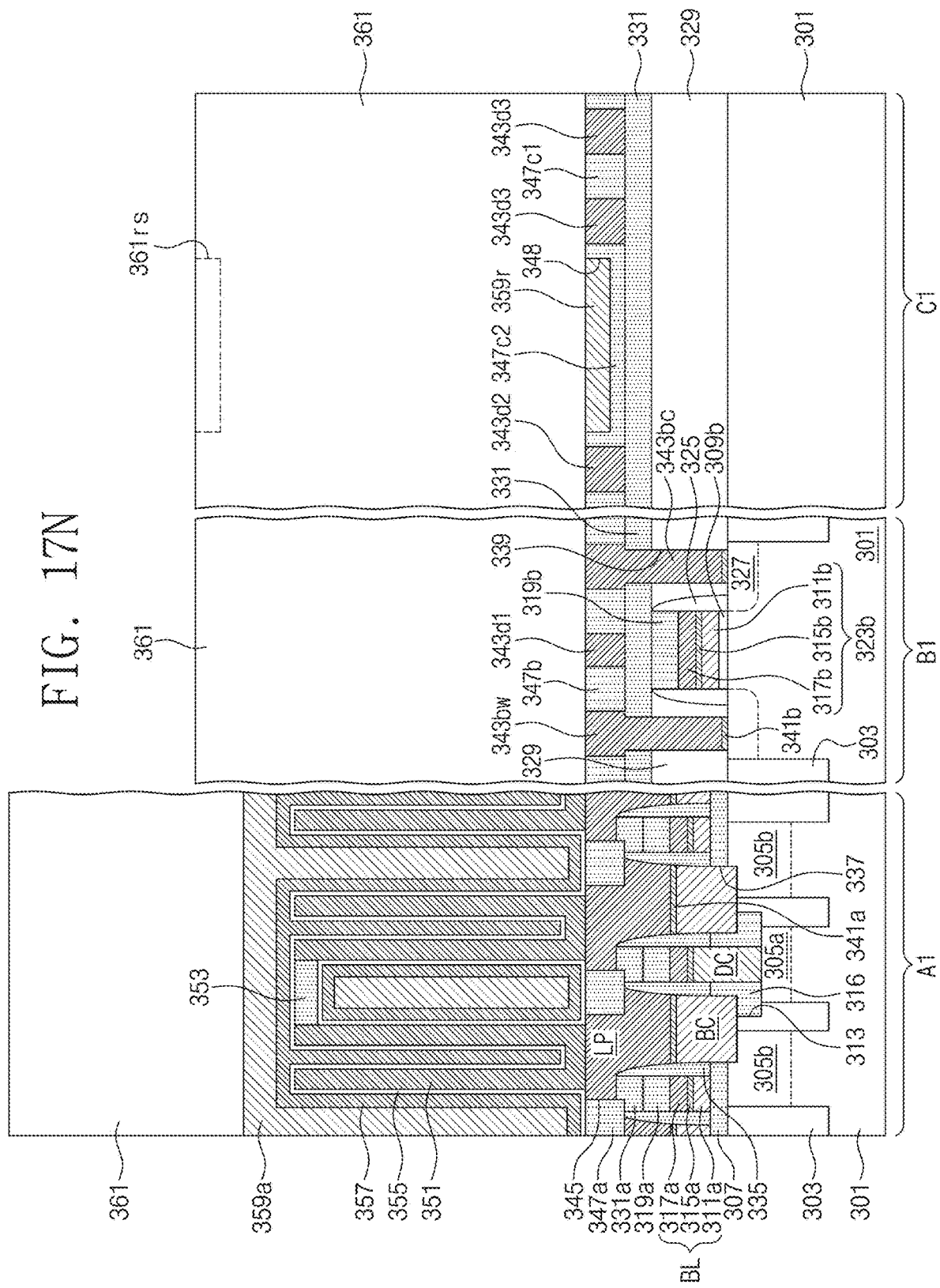

Referring to FIG. 17N, a third interlayered insulating layer 361 may be formed on the semiconductor substrate 301. The third interlayered insulating layer 361 may be formed of or include, for example, a silicon oxide layer or a porous insulating layer. If, in the step of FIG. 17M, the recessed region 348 is not filled with the remaining electrode pattern 359r, the third interlayered insulating layer 361 on the third region C1 may have a recessed top surface profile as depicted by a dotted line 361rs. In this case, the top surface profile of the third interlayered insulating layer 361 on the first to third regions A1, B1, and C1 may have a double stepwise structure. The formation of the double stepwise structure may lead to an increase of technical difficulties in a subsequent process of polishing the third interlayered insulating layer 361, and consequently various issues (e.g., high cost, low productivity, large variation in characteristics, and a short circuit issue caused by a metal residue). However, according to some embodiments of the inventive concept, since the recessed region 348 is filled with the remaining electrode pattern 359r, the double stepwise structure may not be formed, and thus, it may be possible to overcome these issues.

Figure 17O:
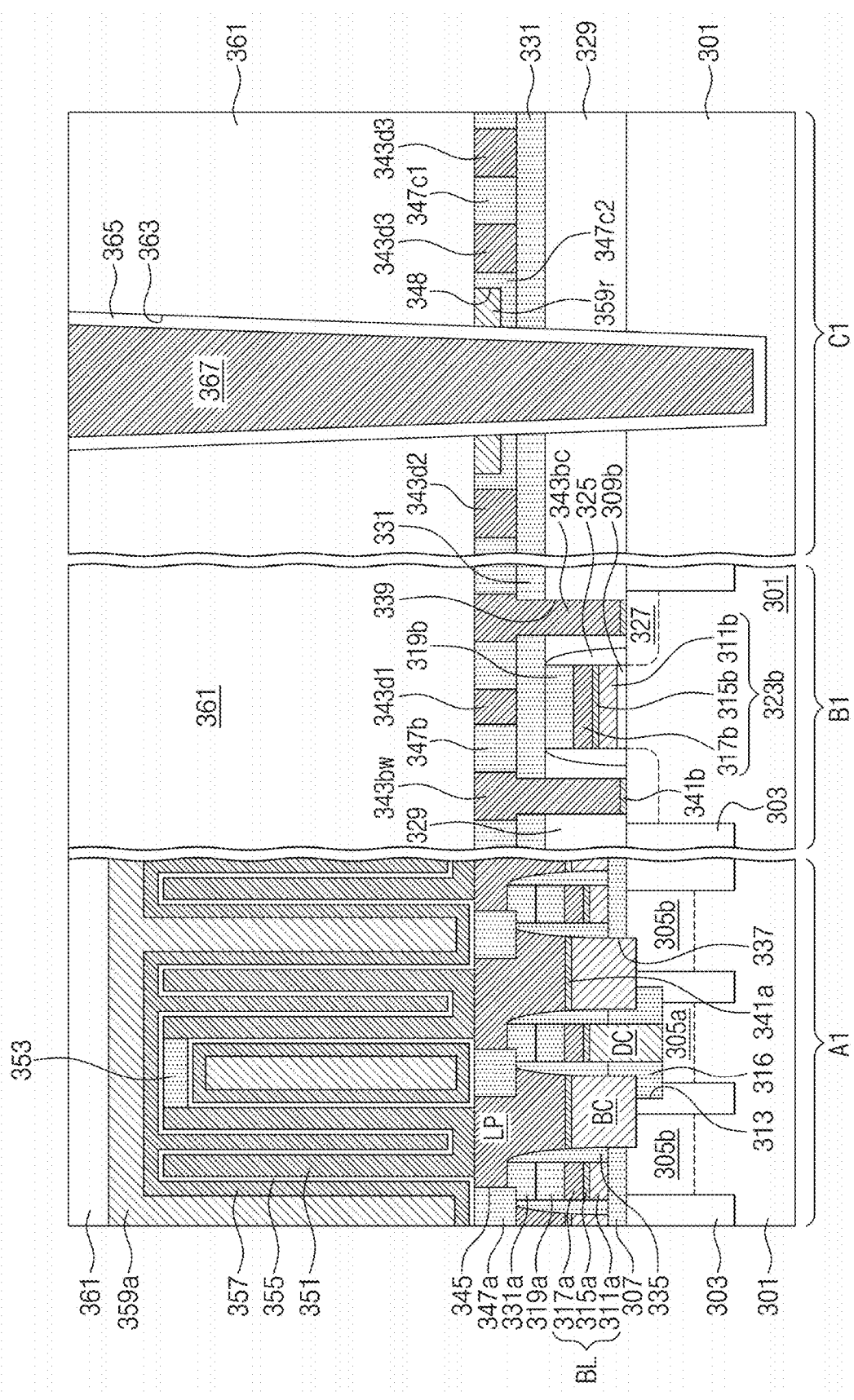

Referring to FIG. 17O, a polishing process may be performed to allow the third interlayered insulating layer 361 to have a flat top surface on the first to third regions A1, B1, and C1. A through electrode hole 363 may be formed on the third region C1 by successively etching the third interlayered insulating layer 361, the remaining electrode pattern 359r, the fourth separation pattern 347c2, the second capping layer 331, the second interlayered insulating layer 329, and a portion of the semiconductor substrate 301. A via insulating layer 365 may be formed on the semiconductor substrate 301 to conformally cover an inner side surface and a bottom surface of the through electrode hole 363. The via insulating layer 365 may be formed of or include, for example, at least one of silicon oxide, silicon nitride, or silicon oxynitride. A conductive layer may be formed on the semiconductor substrate 301 to fill the through electrode hole 363. The conductive layer may be formed of or include at least one of metallic materials (e.g., tungsten, aluminum, and copper). An anisotropic etching process or a polishing process may be performed on the conductive layer and the via insulating layer to expose the third interlayered insulating layer 361. Thus, the via insulating layer 365 may remain in the through electrode hole 363, and the through electrode 367 may be formed in the through electrode hole 363.

Figure 17P:
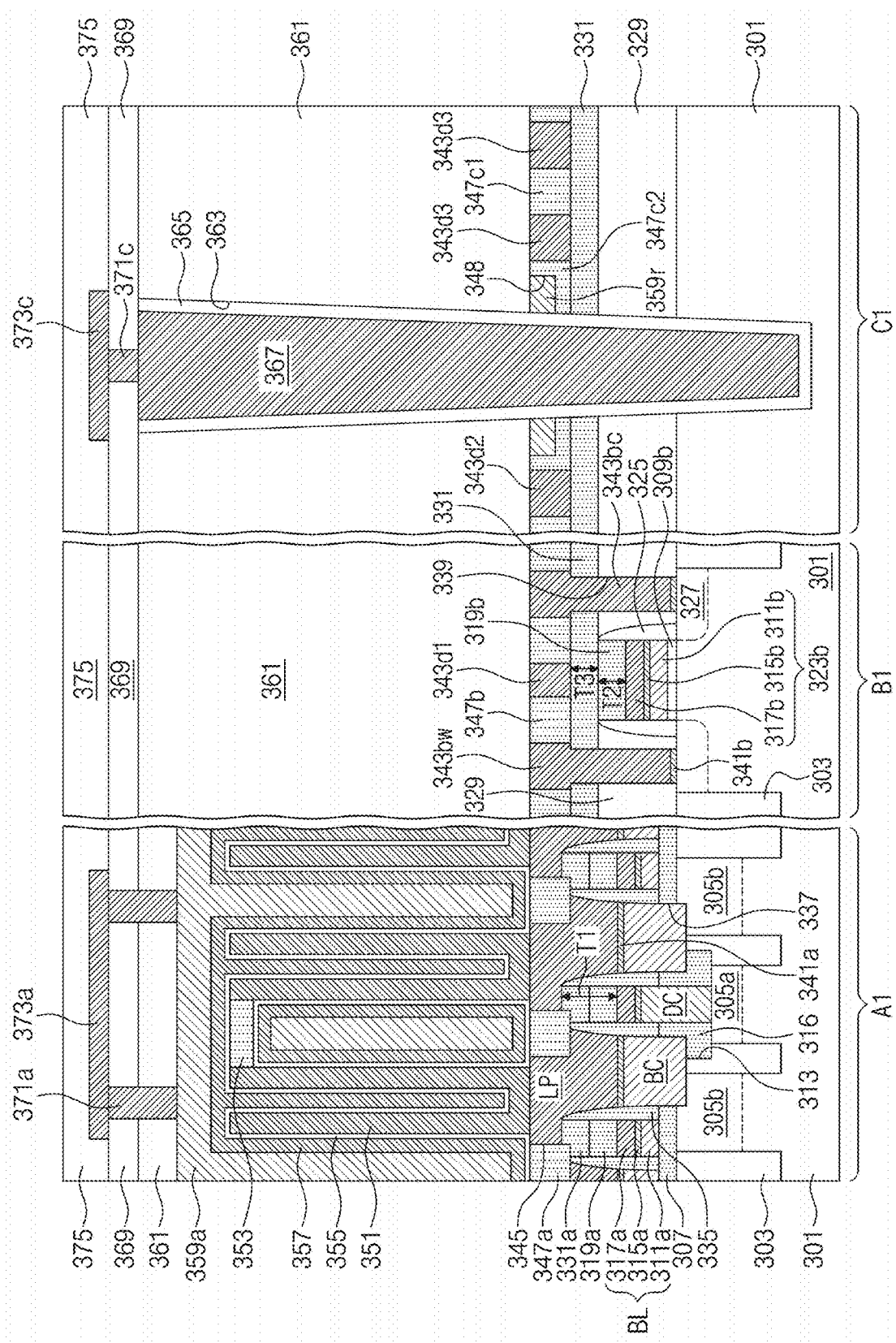

Referring to FIG. 17P, a fourth interlayered insulating layer 369 may be formed on the third interlayered insulating layer 361. On the first region A1, a first upper contact 371a may be formed to penetrate the fourth interlayered insulating layer 369 and the third interlayered insulating layer 361 and to be in contact with the plate electrode 359a. On the third region C1, a second upper contact 371c may be formed to penetrate the fourth interlayered insulating layer 369 and to be in contact with the through electrode 367. A first upper line 373a may be formed on the fourth interlayered insulating layer 369 to be in contact with the first upper contact 371a, and a second upper line 373c may be formed on the fourth interlayered insulating layer 369 to be in contact with the second upper contact 371c. Each of the first and second upper contacts 371a and 371c and the first and second upper lines 373a and 373c may be formed of or include at least one of metallic materials (e.g., tungsten, aluminum, and copper). At least one of the first and second upper lines 373a and 373c may be used as an interconnection line or a pad connected to an outer terminal. An upper insulating layer 375 may be formed to cover the first and second upper lines 373a and 373c. The upper insulating layer 375 may be formed of or include at least one of silicon oxide, silicon nitride, silicon oxynitride, or polyimide.

Referring to FIG. 17P, the semiconductor substrate 301 may include first to third regions A1, B1, and C1, as described above. The bit lines BL may be provided on the first region A1. The first capping pattern 319a and the second capping pattern 331a may be sequentially stacked on the bit lines BL. The storage node contact BC may be provided between the bit lines BL. The landing pad LP may be provided on the storage node contact BC. A capacitor including the lower electrode 351, the dielectric layer 355, and the upper electrode 357 may be provided on the landing pad LP. The capacitor may be covered with the plate electrode 359a.

In the meantime, the peripheral gate insulating pattern 309b, the peripheral gate electrode 323b, and the peripheral capping pattern 319b may be sequentially stacked on the second region B1 of the semiconductor substrate 301. The semiconductor substrate 301 around the peripheral gate electrode 323b may be covered with the second interlayered insulating layer 329. The second capping layer 331 may be provided on the second interlayered insulating layer 329 and the peripheral capping pattern 319b. The peripheral conductive patterns 343bw may be provided on the second capping layer 331, and the first dummy conductive pattern 343d1 may be provided between peripheral conductive patterns 343bw.

A sum of thicknesses of the first and second capping patterns 319a and 331a may correspond to a first thickness T1. The first thickness T1 may be greater than a second thickness T2 of the peripheral capping pattern 319b. The first thickness T1 may be greater than a third thickness T3 of the second capping layer 331. The first thickness T1 may be substantially equal to a sum of the second and third thicknesses T2 and T3.

The second interlayered insulating layer 329 and the second capping layer 331 may be stacked on the third region C1 of the semiconductor substrate 301. The second dummy conductive pattern 343d2 and the third dummy conductive patterns 343d3 may be provided on the second capping layer 331. A distance between the third dummy conductive patterns 343d3 may be equal or similar to the distance between the landing pads LP. A distance between the second and third dummy conductive patterns 343d2 and 343d3 may be larger than the distance between the landing pads LP. The fourth separation pattern 347c2 may be provided between the second and third dummy conductive patterns 343d2 and 343d3. The fourth separation pattern 347c2 may be provided to have the recessed region 348 at its upper portion. The recessed region 348 may be filled with the remaining electrode pattern 359r. The remaining electrode pattern 359r may have a top surface that is coplanar with that of the fourth separation pattern 347c2. The remaining electrode pattern 359r may be formed of or include the same material as that of the plate electrode 359a. The remaining electrode pattern 359r may be covered with the third interlayered insulating layer 361. The through electrode 367 may be provided to penetrate the third interlayered insulating layer 361, the remaining electrode pattern 359r, the fourth separation pattern 347c2, the second capping layer 331, and the second interlayered insulating layer 329 and may be extended into the semiconductor substrate 301. The via insulating layer 365 may be interposed between the through electrode 367 and the remaining electrode pattern 359r.

In the semiconductor device according to some example embodiments of the inventive concept, the remaining electrode pattern 359r may be used to prevent formation of a double stepwise structure. Thus, it may be possible to prevent large variation in characteristics and a short circuit issue caused by a metal residue and thereby to improve reliability of the device.

Figure 18:
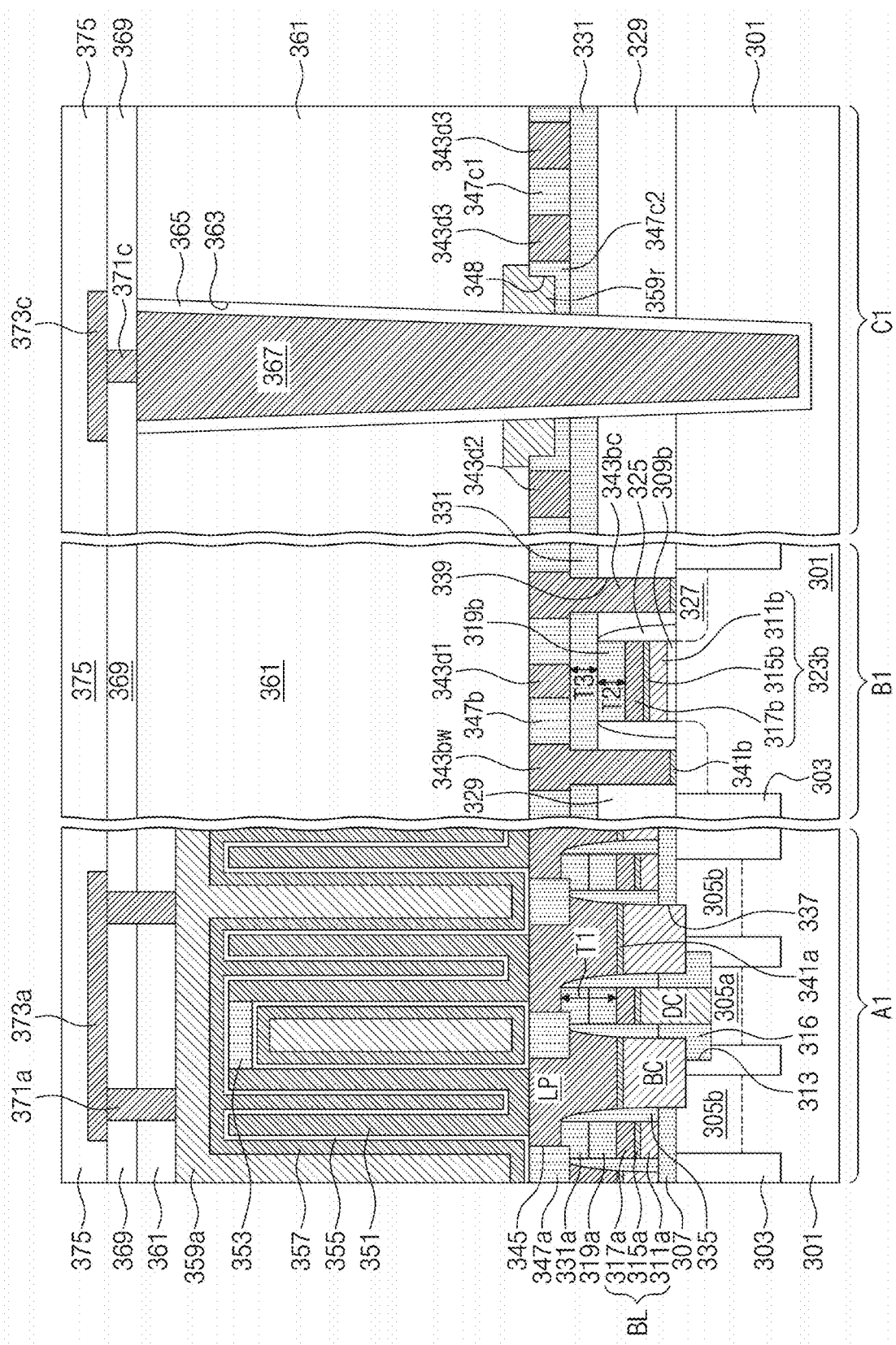
FIG. 18 is a sectional view illustrating a semiconductor device according to some example embodiments of the inventive concept.

FIG. 18 is a sectional view illustrating a semiconductor device according to some example embodiments of the inventive concept.

Referring to FIG. 18, in a semiconductor device according to some embodiments of the inventive concept, the remaining electrode pattern 359r may have a protruding top surface that is higher than the top surface of the fourth separation pattern 347c2. An upper portion of the remaining electrode pattern 359r may be extended out of the recessed region 348 to be in contact with the top surface of the fourth separation pattern 347c2. The structure of FIG. 18 may be formed by using a mask pattern, which is formed to cover a region for the remaining electrode pattern 359r when the plate electrode layer is etched in the step of FIG. 17M. Except for these differences, a structure of a semiconductor device or its fabricating method may be substantially the same as those described above.

Figure 19:
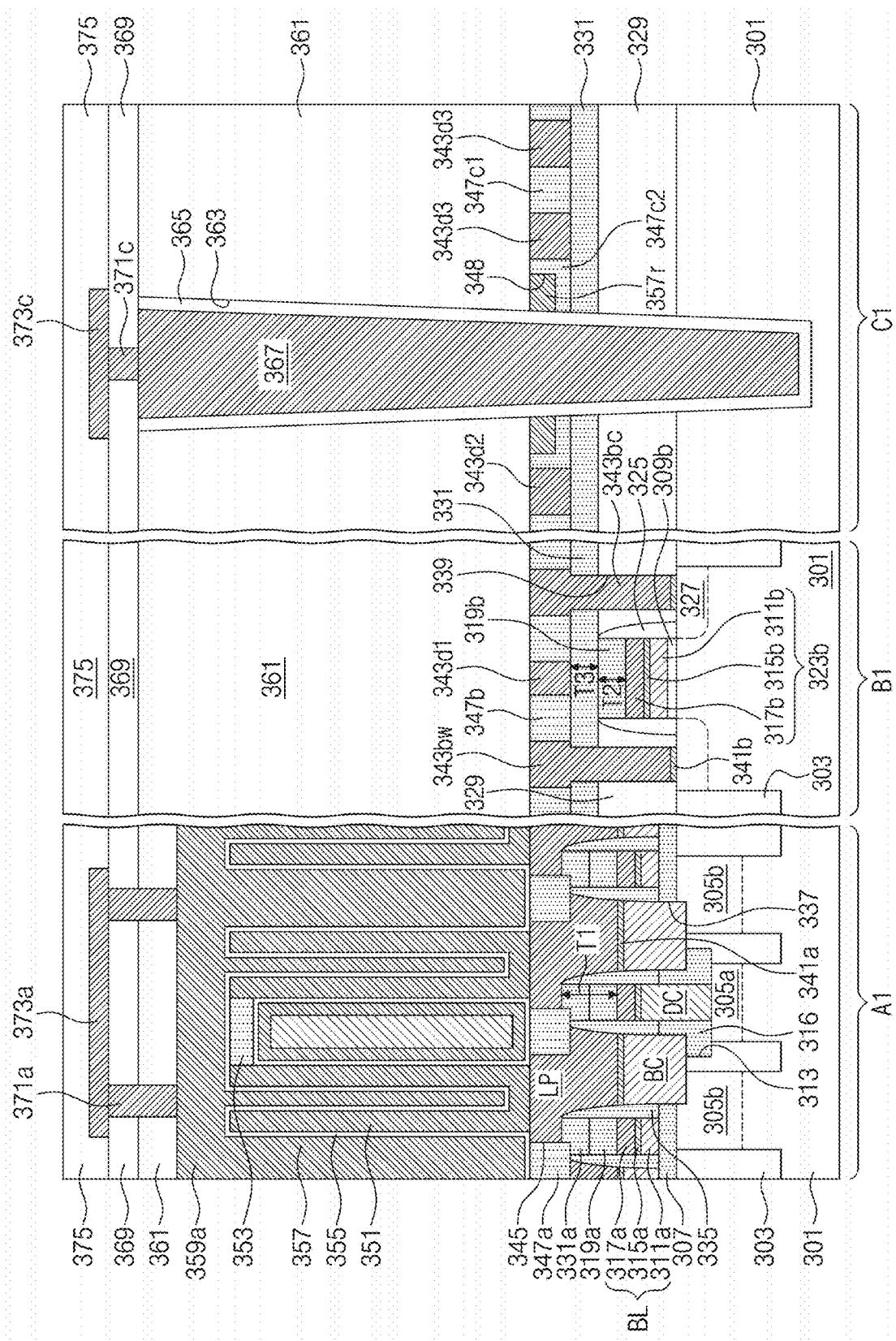
FIG. 19 is a sectional view illustrating a semiconductor device according to some example embodiments of the inventive concept.

FIG. 19 is a sectional view illustrating a semiconductor device according to some example embodiments of the inventive concept.

Referring to FIG. 19, the upper electrode 357a may be provided, but the plate electrode 359a of FIG. 17P may not be provided. The upper electrode 357a may be formed of at least one of titanium nitride, doped silicon germanium, or tungsten. In addition, a remaining electrode pattern 357r in the present embodiment may be formed of the same material as that of the upper electrode 357a. The remaining electrode pattern 357r and the upper electrode 357a may be formed at the same time. Except for these differences, a structure of a semiconductor device or its fabricating method may be substantially the same as those described above.

According to some embodiments of the inventive concept, it may be possible to improve reliability of a semiconductor device.

According to some embodiments of the inventive concept, it may be possible to prevent a double stepwise structure from being formed, before a polishing process.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
    a semiconductor substrate including a first region and a second region;
    a dummy separation pattern provided on the second region of the semiconductor substrate to have a recessed region at its upper portion;
    a remaining electrode pattern provided in the recessed region; and
    a through electrode provided to penetrate an interlayered insulating layer, the remaining electrode pattern, and the dummy separation pattern and to be extended into the semiconductor substrate,
    wherein the remaining electrode pattern is formed of a conductive layer.

2. The semiconductor device of claim 1, further comprising:
    a first electrode provided on the first region of the semiconductor substrate;
    a dielectric layer covering the first electrode; and
    a second electrode covering the dielectric layer,
    wherein the second electrode contains a same material as the remaining electrode pattern.

3. The semiconductor device of claim 2, further comprising:
    first dummy pads provided on the second region of the semiconductor substrate; and
    a second dummy pad provided on the second region and adjacent to at least one of the first dummy pads,
    wherein the dummy separation pattern is provided between the first dummy pads, and
    a first space between the first dummy pads is greater than a second space between the second dummy pad and one of the first dummy pads adjacent the second dummy pad.

4. The semiconductor device of claim 3, further comprising:
    landing pads, which are provided on the first region and between a lower electrode and the semiconductor substrate and are spaced apart from each other,
    wherein the first space is greater than a third space between the landing pads.

5. The semiconductor device of claim 4, further comprising:
    a bit line provided between the landing pads and the semiconductor substrate and electrically disconnected from the landing pads;
    a bit line capping pattern interposed between the bit line and the landing pads;
    a peripheral gate electrode provided on the second region of the semiconductor substrate and spaced apart from the through electrode; and
    a peripheral gate capping pattern provided on the peripheral gate electrode,
    wherein the bit line capping pattern has a first thickness,
    the peripheral gate capping pattern has a second thickness, and
    the first thickness is greater than the second thickness.

6. The semiconductor device of claim 5, further comprising:
    an etch stop layer, which is provided on the peripheral gate capping pattern and has a third thickness,
    wherein the first thickness is greater than the third thickness.

7. The semiconductor device of claim 6, wherein a sum of the third thickness and the second thickness is equal to the first thickness.

8. A semiconductor device, comprising:
    a semiconductor substrate including a first region and a second region;
    landing pads provided on the first region of the semiconductor substrate and spaced apart from each other by a first space;
    first dummy pads provided on the second region of the semiconductor substrate and spaced apart from each other by a second space greater than the first space;
    first electrodes provided on the landing pads, respectively;
    a dummy separation pattern provided between the first dummy pads to have a recessed region at its upper portion; and
    a remaining electrode pattern filling the recessed region,
    wherein the remaining electrode pattern is formed of a conductive layer.

9. The semiconductor device of claim 8, further comprising:
    a through electrode, which is provided on the second region to penetrate the remaining electrode pattern and the dummy separation pattern and to be extended into the semiconductor substrate.

* * * * *